United States Patent [19]
Tomoyasu et al.

[11] Patent Number: 5,900,103
[45] Date of Patent: May 4, 1999

[54] PLASMA TREATMENT METHOD AND APPARATUS

[75] Inventors: Masayuki Tomoyasu, Nirasaki; Akira Koshiishi, Kofu, both of Japan

[73] Assignee: Tokyo Electron Limited, Tokyo, Japan

[21] Appl. No.: 08/424,127

[22] Filed: Apr. 19, 1995

[30] Foreign Application Priority Data

| Apr. 20, 1994 | [JP] | Japan | 6-106045 |
| Apr. 28, 1994 | [JP] | Japan | 6-113587 |
| May 24, 1994 | [JP] | Japan | 6-133638 |
| Jun. 1, 1994 | [JP] | Japan | 6-142409 |

[51] Int. Cl.⁶ ............................................. H05H 1/00
[52] U.S. Cl. ............. 156/345; 118/723 E; 204/298.34; 315/111.21
[58] Field of Search ................ 156/345; 204/298.34, 204/298.08; 118/723 E; 315/111.21

[56] References Cited

U.S. PATENT DOCUMENTS

| 4,863,549 | 9/1989 | Grunwald | 204/298.34 X |
| 5,057,185 | 10/1991 | Thomas, III et al. | 204/298.34 X |
| 5,110,438 | 5/1992 | Ohmi et al. | 204/298.34 |
| 5,116,482 | 5/1992 | Setoyama et al. | 204/298.34 X |
| 5,272,417 | 12/1993 | Ohmi | 204/298.34 X |
| 5,330,606 | 7/1994 | Kubota et al. | 204/298.34 X |
| 5,332,880 | 7/1994 | Kubota et al. | 204/298.34 X |

FOREIGN PATENT DOCUMENTS

| 0 309 648 | 4/1989 | European Pat. Off. |
| 0 359 966 | 3/1990 | European Pat. Off. |
| 57-131373 | 8/1982 | Japan |
| 57-131374 | 8/1982 | Japan |
| 60-86831 | 5/1985 | Japan |
| 2-177429 | 7/1990 | Japan |

OTHER PUBLICATIONS

Journal of Vaccum Science and Technology: Part A, vol. 4, No. 3, pp. 729–738, May/June 1986, D.L. Flamm, "Frequency Effects in Plasma Etching".

*Primary Examiner*—Thi Dang
*Attorney, Agent, or Firm*—Oblon, Spivak, McClelland, Maier & Neustadt, P.C.

[57] ABSTRACT

A plasma treatment method comprising exhausting a process chamber so as to decompress the process chamber, mounting a wafer on a suscepter, supplying a process gas to the wafer through a shower electrode, applying high frequency power, which has a first frequency $f_1$ lower than an inherent lower ion transit frequencies of the process gas, to the suscepter, and applying high frequency power, which has a second frequency $f_2$ higher than an inherent upper ion transit frequencies of the process gas, whereby a plasma is generated in the process chamber and activated species influence the wafer.

2 Claims, 22 Drawing Sheets

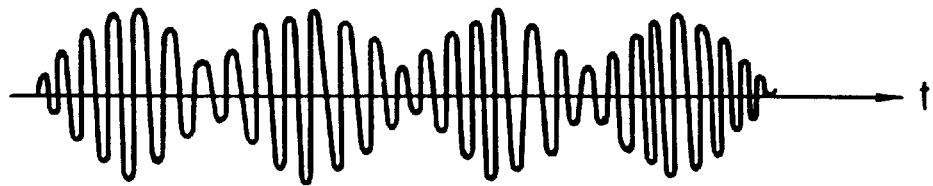
F I G. 3
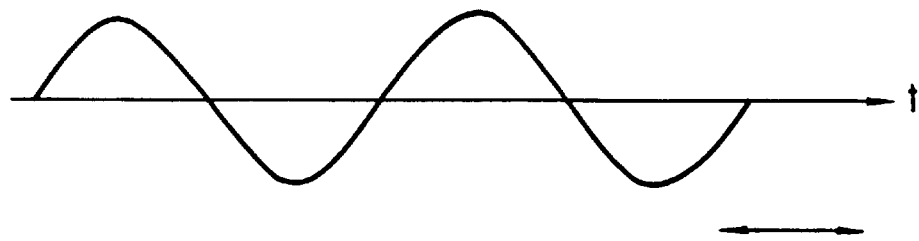
F I G. 4
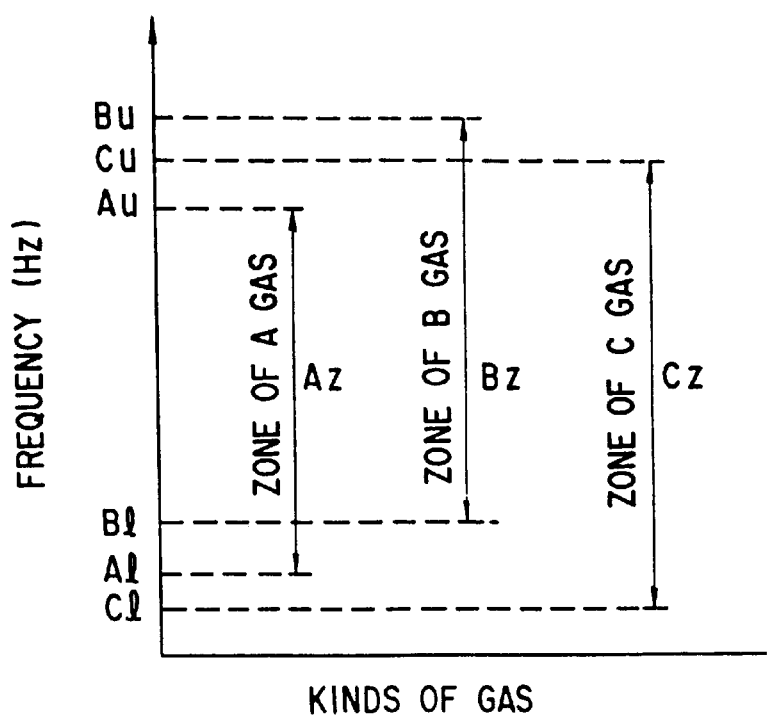
F I G. 5

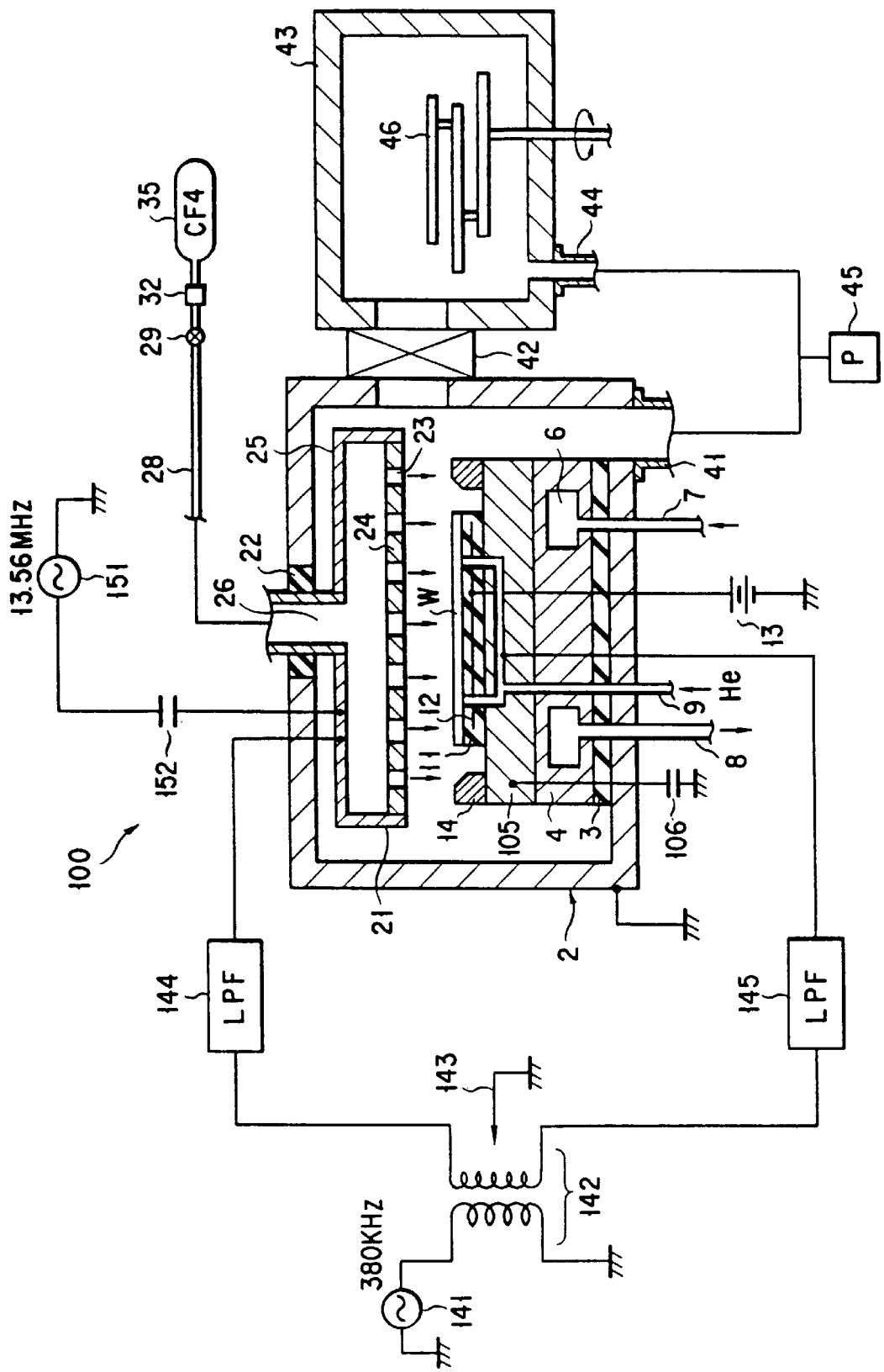
F I G. 6

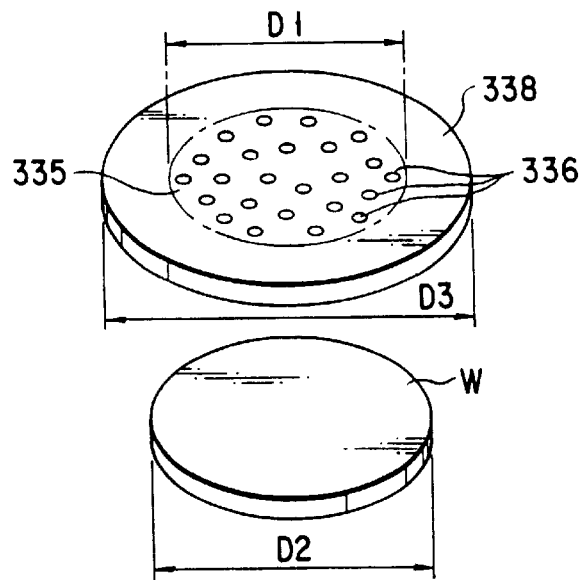
F I G. 12
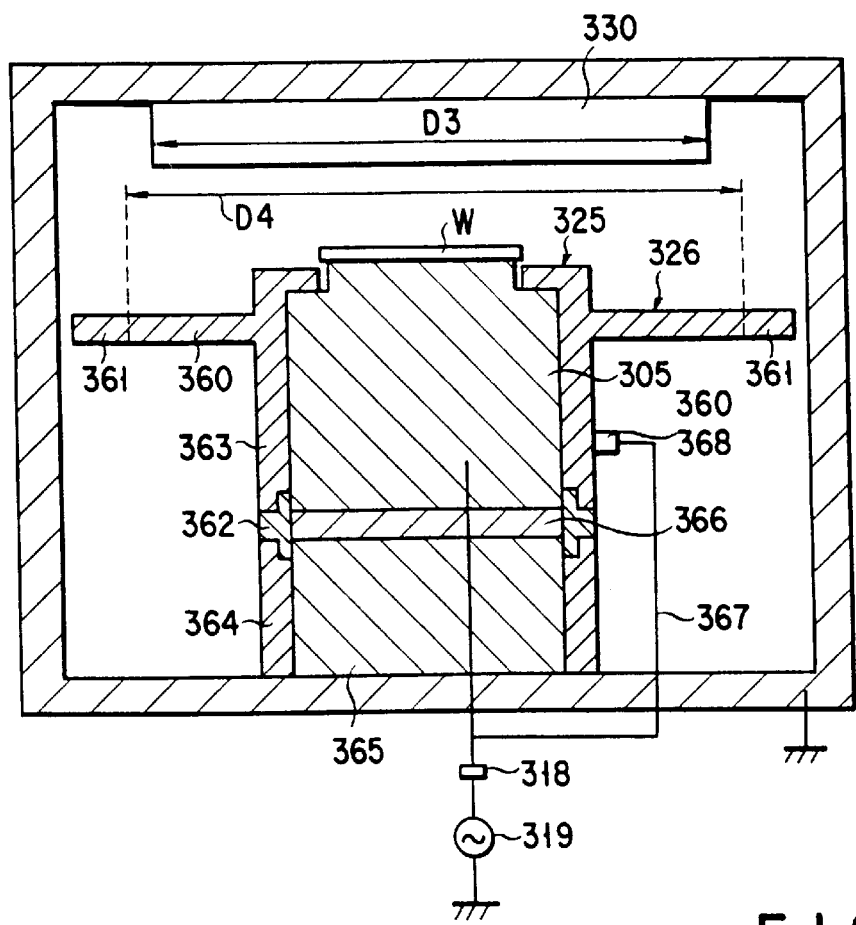
F I G. 13

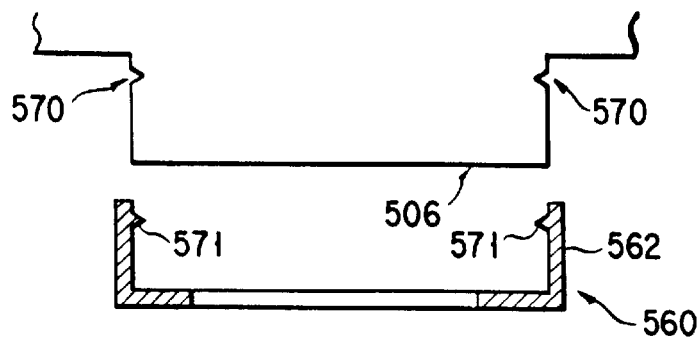
F I G. 21
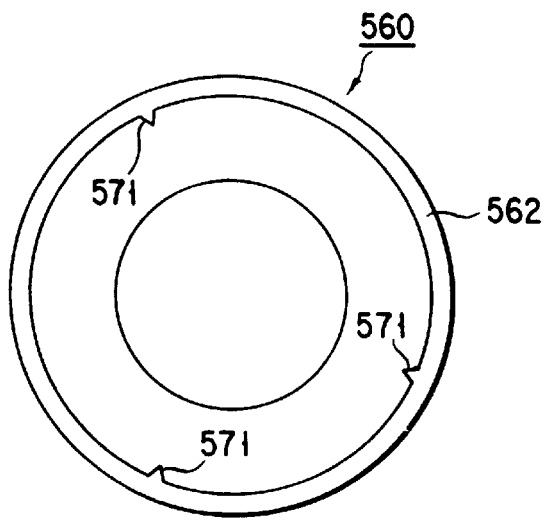
F I G. 22
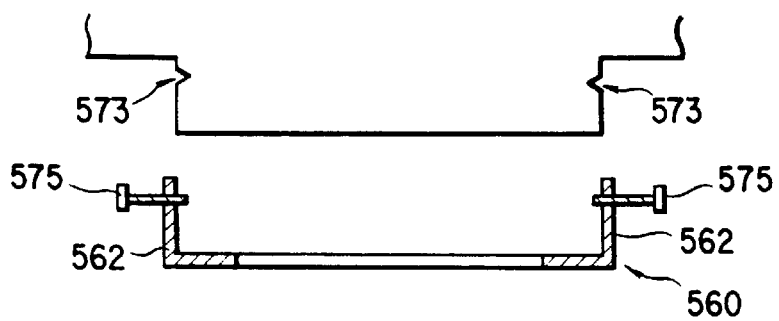
F I G. 23

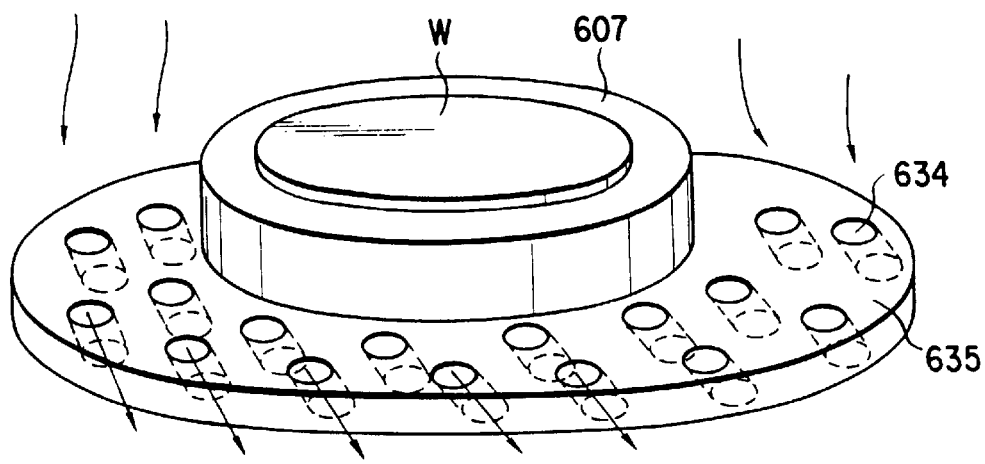
F I G. 30
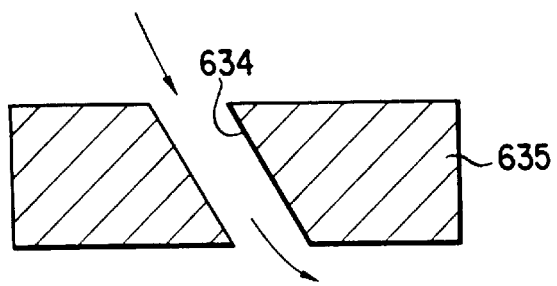
F I G. 31
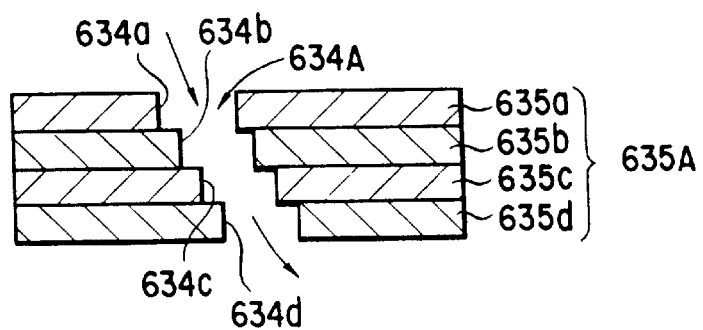
F I G. 32

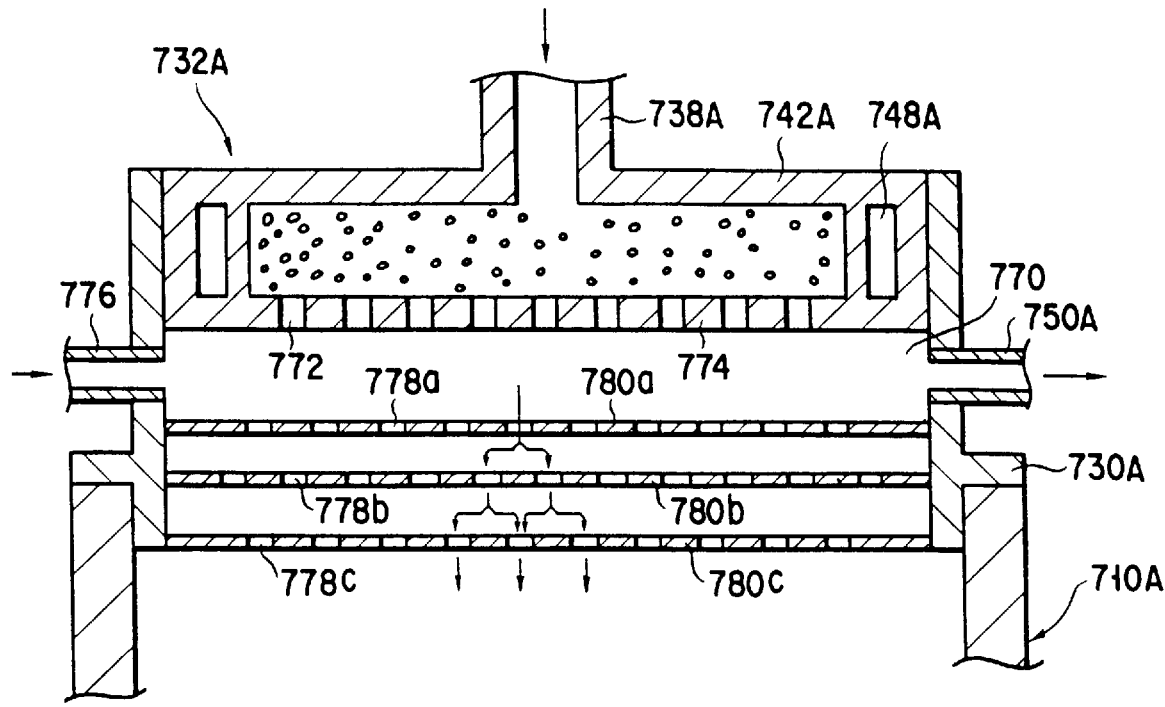
F I G. 37
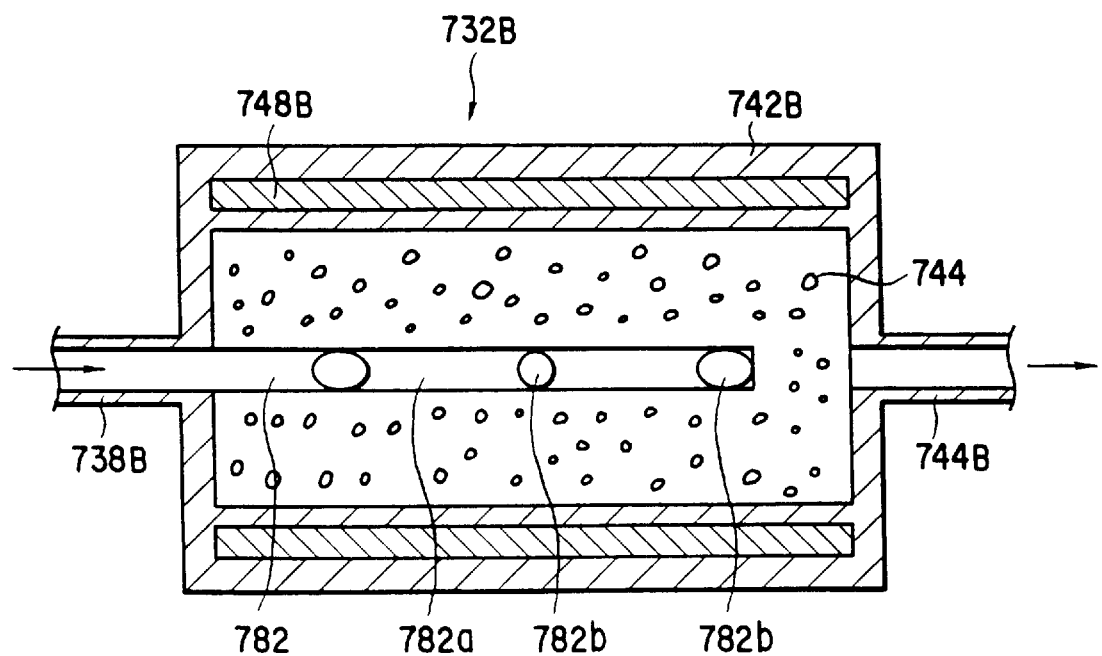
F I G. 38

PLASMA TREATMENT METHOD AND APPARATUS

BACKGROUND OF THE INVENTION

1. Field of the Invention

The present invention relates to a plasma treatment method by which substrates such as semiconductor wafers are etched or sputtered under plasma atmosphere. It also relates to a plasma treatment apparatus for the same.

2. Description of the Related Art

Recently, semiconductor devices are more and more highly integrated and the plasma treatment is therefore asked to have a finer workability in their making course. In order to achieve such a finer workability, the process chamber must be decompressed to a greater extent, plasma density must be kept higher and the treatment must have a higher selectivity. In the case of the conventional plasma treatment methods, however, high frequency voltage becomes higher as output is made larger, and ion energy, therefore, becomes stronger than needed. The semiconductor wafer becomes susceptible to damage, accordingly. Further, the process chamber is kept about 250 mTorr in the case of the conventional methods and when the degree of vacuum in the process chamber is made higher (or the internal pressure in the chamber is made smaller), plasma cannot be kept stable and its density cannot be made high.

SUMMARY OF THE INVENTION

When gases are made plasma, the action of ions in the plasma becomes different, depending upon frequencies of high frequency power. In short, ion energy and plasma density can be controlled independently of the other when high frequency power having two different frequencies is applied to process gases. However, ions (loaded particles) easily run from plasma to the wafer at a frequency band, but it becomes difficult for them to run from the plasma sheath to the wafer at another frequency band (or transit frequency zone). The so-called follow-up of ions becomes unstable.

Particularly molecular gases change their dissociation, depending upon various conditions (such as kinds of gas, flow rate, high frequency power applying conditions and internal pressure and temperature in the process chamber), and the follow-up of ions in the plasma sheath changes in response to this changing dissociation. Further, the follow-up of ions at the transit frequency zone also depends upon their volume (or mass). Particularly in the case of molecular gases used in etching and CVD, the dissociation of gas molecules progresses to an extent greater than needed when electron temperature becomes high with a little increase of high frequency power, and the behavior of ions in the plasma sheath changes accordingly. Plasma properties such as ion current density become thus unstable and the plasma treatment becomes uneven, thereby causing the productivity to be lowered.

When the frequency of high frequency power is only made high to increase plasma density, the dissociation of gas molecules progresses to the extent greater than needed. It is therefore desirable that the plasma density is raised not to depend upon whether the frequency is high or low.

An object of the present invention is therefore to provide plasma treatment method and apparatus capable of controlling both of the dissociation of gas molecules and the follow-up of ions and also capable of promoting the incidence of ions onto a substrate to be treated.

Another object of the present invention is to provide plasma treatment method and apparatus capable of raising the plasma density with smaller high frequency power not to damage the substrate to be treated.

According to the present invention, there can be provided a plasma treatment method of plasma-treating a substrate to be treated under decompressed atmosphere comprising exhausting a process chamber; mounting the substrate on a lower electrode; supplying plasma generating gas to the substrate on the lower electrode through an upper electrode; applying high frequency power having a first frequency $f_1$, lower than the lower limit of ion transit frequencies characteristic of process gas, to the lower electrode; and applying high frequency power having a second frequency, higher than the upper limit of ion transit frequencies characteristic of process gas, to the upper electrode, whereby a plasma generates in the process chamber and activated species influence the substrate to be treated.

It is preferable that the first frequency $f_1$ is set lower than 5 MHz, more preferably in a range of 100 kHz–1 MHz. It is also preferable that the second frequency $f_2$ is set higher than 10 MHz, more preferably in a range of 10 MHz–100 MHz.

High frequency power having the frequency lower than the lower limit of ion transit frequencies is applied to the lower electrode. Therefore, the follow-up of ions becomes more excellent and ions can be more efficiently accelerated with a smaller power. In addition, both of ion and electron currents change more smoothly. Further, the follow-up of ions does not depend upon kinds of ion. The plasma treatment can be thus made more stable even when the degree in the process chamber and the rate of gases mixed change. On the other hand, high frequency power having the frequency higher than the upper limit of ion transit frequencies is applied to the upper electrode. Therefore, ions can be left free from frequencies of their transit frequency zone to thereby enable more stable plasma to be generated.

Ion transit frequency zones of process gases used by the plasma treatment in the process, such as etching, CVD and sputtering, of making semiconductor devices are almost all in the range of 1 MHz–10 MHz.

Impedances including such capacitive components that the impedance relative to high frequency power becomes smaller than several kΩ and that the impedance relative to relatively low frequency power becomes larger than several Ω are arranged in series between the upper electrode and its matching circuit and between them and the ground. Current is thus made easier to flow to raise the plasma density and ion control.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 shows a waveform of frequency applied to an upper (or second) electrode;

FIG. 4 shows a waveform of frequency applied to a lower (or first) electrode (or suscepter);

FIG. 5 is a graph showing transit frequency zones of various gases;

FIG. 6 is a block diagram showing the plasma etching apparatus according to another embodiment of the present invention;

FIG. 12 is a perspective view showing an upper shower electrode and a semiconductor wafer dismantled;

FIG. 13 is a block diagram showing the plasma etching apparatus according to a still further embodiment of the present invention;

FIG. 21 is a vertically-sectioned view showing the cover for the upper shower electrode;

FIG. 22 is a plan view showing the cover for the upper shower electrode;

FIG. 23 shows how the cover is attached to the upper shower electrode;

FIG. 30 is a perspective view showing a baffle member arranged on the side of the suscepter;

FIG. 31 is a vertically-sectioned view showing a hole formed in the baffle member;

FIG. 32 is a vertically-sectioned view showing another hole formed in the another baffle member;

FIG. 37 is a sectional view showing another vaporizer;

FIG. 38 is a sectional view showing a further vaporizer;

DETAILED DESCRIPTION OF THE PREFERRED EMBODIMENTS

Figure 1:
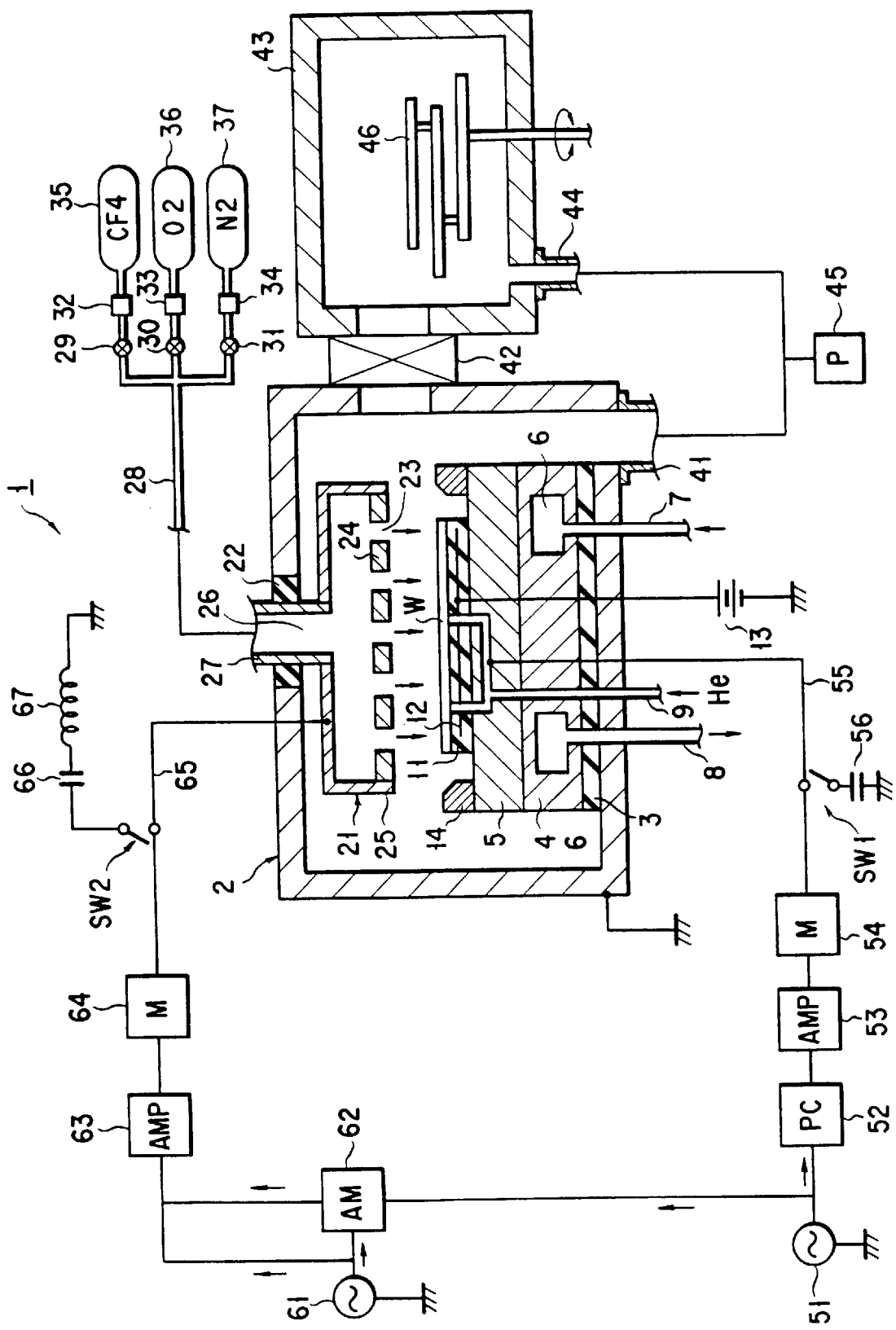
FIG. 1 is a block diagram showing the plasma etching apparatus according to an embodiment of the present invention.

Some embodiments of the present invention will be described with reference to the accompanying drawings. Referring to FIGS. 1 through 5, a first embodiment will be described.

A process chamber 2 of an etching treatment apparatus 1 is assembled by alumite-processed aluminium plates. It is earthed and a suscepter 5 insulated by an insulating plate 3 is arranged in it. The suscepter 5 is supported by its bottom through the insulating plate 3 and a support 4.

A coolant chamber 6 is formed in the suscepter support 4. It is communicated with a coolant supply supply (not shown) through inlet and outlet pipes 7 and 8 and coolant such as liquid nitrogen is circulated between it and the coolant supply supply.

An internal passage 9 is formed in a suscepter assembly which comprises the insulating plate 3, the support 4, the suscepter 5 and an electrostatic chuck 11, and heat exchanger gas such as helium gas is supplied from a gas supply supply (not shown) to the underside of a wafer W through it.

The top center portion of the suscepter 5 is swelled and the electrostatic chuck 11, same in shape as the wafer W, is mounted on the swelled portion of the suscepter 5. A conductive layer 12 of the electrostatic chuck 11 is sandwiched between two sheets of high molecular polyimide film. It in connected to a 1.5 kV DC high voltage power supply 13 arranged outside the process chamber 2.

A focus ring 14 is arranged on the top of the suscepter 5 along the outer rim thereof, enclosing the wafer W. It is made of insulating material not to draw reactive ions.

An upper electrode 21 is opposed to the top of the suscepter assembly. Its electrode plate 24 is made of SiC or amorphous carbon and its support member 25 is made by an alumite-process aluminium plate. Its underside is separated from the wafer W on the suscepter assembly by about 15–20 mm. It is supported by the top of the process chamber 2 through an insulating member 22. A plurality of apertures 23 are formed in its underside.

A gas inlet 26 is formed in the center of the support 25 and a gas inlet pipe 27 is connected to it. A gas supply pipe 28 is connected to the gas inlet pipe 27. The gas supply pipe 28 is divided into three which are communicated with process gas supply sources 35, 36 and 37, respectively. The first one is communicated with the $CF_4$ gas supply source 35 through a valve 29 and a mass flow controller 32. The second one with the $O_2$ gas supply supply 36 through a valve 30 and a mass flow controller 33. The third one with the $N_2$ gas supply supply 37 through valve 31 and a mass flow controller 34.

An exhaust pipe 41 is connected to the bottom of the process chamber 2. An exhaust pipe 44 is also connected to the bottom of an adjacent load lock chamber 43. Both of them are communicated with a common exhaust mechanism 45 which is provided with a turbo molecular pump and the like. The load lock chamber 43 is connected to the process chamber 2 through a gate valve 42. A carrier arm mechanism 46 is arranged in the load lock chamber 43 to carry the wafers W one by one between the process chamber 2 and the load lock chamber 43.

A high frequency power applier means for generating plasma in the process chamber 2 will be described.

A first oscillator 51 serves to oscillate high frequency signal having a frequency of 800 kHz. A circuit extending from the oscillator 51 to the lower electrode (or suscepter) 5 includes a phase controller 52, an amplifier 53, a matching unit 54, a switch $SW_1$ and a feeder rod 55. The amplifier 53 is an RF generator and the matching unit 54 includes a decoupling capacitor. The switch $SW_1$ is connected to the feeder rod 55. A capacitance 56 is arranged on an earthed circuit of the feeder rod 55. The phase controller 52 houses a bypass circuit (not shown) and a changeover switch (not shown) therein to enable signal to be sent from the first oscillator 51 to the amplifier 53 through the bypass circuit. High frequency signal oscillated is applied to the suscepter 5 through the phase controller 52, the amplifier 53, the matching unit 54 and feeder rod 55.

On the other hand, a second oscillator 61 serves to oscillate high frequency signal having a frequency of 27 MHz. A circuit extending from the oscillator 61 to the upper (or shower) electrode 21 includes an amplitude modulator 62, an amplifier 63, a matching unit 64, a switch $SW_2$ and a feeder rod 65. The amplitude modulator 62 is connected to a signal circuit of the second oscillator 61 and also to that of the first oscillator 51. It houses a bypass circuit (not shown) and a changeover switch (not shown) in it to enable signal to be sent from it to the amplifier 63 through the bypass circuit. The amplifier 63 is an RF generator and the matching unit 64 includes a decoupling capacitor. The switch $SW_2$ is connected to the feeder rod 65. A capacitance 66 and an inductance 67 are arranged on an earthed circuit of the feeder rod 65. High frequency signal oscillated is applied to the upper electrode 21 through the amplitude modulator 62, the amplifier 63, the matching unit 64 and the feeder rod 65. High frequency signal having the frequency of 800 kHZ can also be applied, as modulated wave, to the amplitude modulator 62.

The reason why the earthed circuit of the feeder rod 55 includes no inductance resides in that the electrostatic chuck 11, the gas passage 9, the coolant chamber 6, lifter pins (not shown) and the like are included in the lower electrode signal transmission circuit, that the feeder rod 55 itself is long, and that the suscepter 5 itself has large inductance accordingly.

The amplifiers 51 and 64 are arranged independently of the other. Therefore, voltages applied to the upper electrode 21 and the suscepter 5 can be changed independently of the other.

Figure 2:
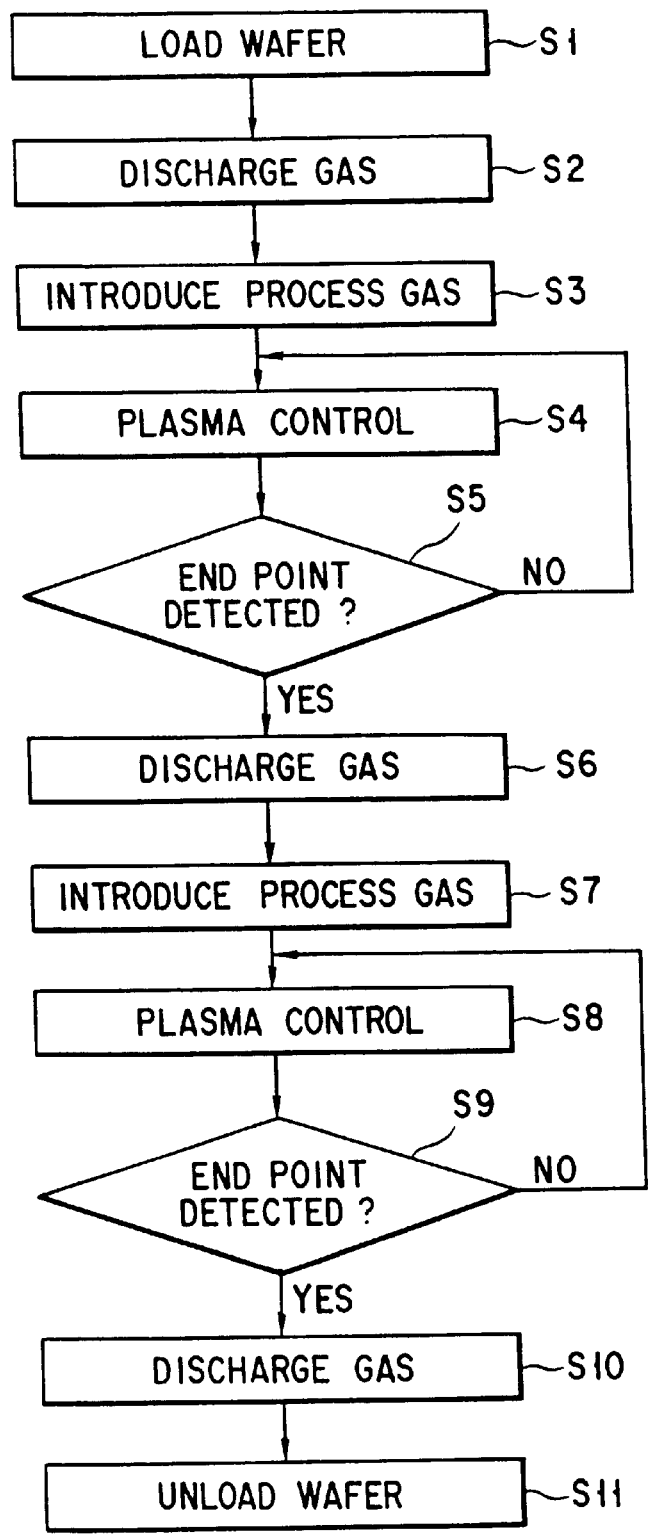
FIG. 2 is a flow chart showing the plasma etching method according to an embodiment of the present invention.

Referring to FIG. 2, it will be described how silicon oxide film ($SiO_2$) on the silicon wafer W is plasma-etched.

Both of the load lock chamber 43 and the process chamber 2 are exhausted to substantially same internal pressure. The gate valve 42 is opened and the wafer W is carried from the load lock chamber 43 into the process chamber 2 (step S1). The gate valve 42 is closed and the process chamber 2 is further exhausted to set its internal pressure in a range of 10–250 mTorr (step S2).

The valves 29 and 30 are opened, and $CF_4$ and $O_2$ gases are introduced into the process chamber 2. Their flow rates are controlled and they are mixed at a predetermined rate. The ($CF_4+O_2$) mixed gases are supplied to the wafer W through apertures 23 of the upper shower electrode 21 (step S3). When the internal pressure in the chamber 2 becomes stable at about 1 Pa, high frequency voltages are applied to the upper and lower electrodes 21 and 5 to generate plasma between them.

Frequencies of high frequency power applied to the upper and lower electrodes 21 and 5 to generate plasma are controlled as follows (step S4).

The switches $SW_1$ and $SW_2$ are opened to disconnect (OFF) the capacitance 56 from the feeder rod 55 and the capacitance 66 and the inductance 67 from the feeder rod 65. When the oscillators 61, 51, the amplitude modulator 62 and the amplifiers 63, 53 are made operative under this state, high frequency power having a certain waveform is applied to the upper electrode 21. High frequency power having a frequency same as or higher than the higher one of upper ion transit frequencies characteristic of $CF_4$ and $O_2$ gases is applied to the upper electrode 21. High frequency power having a waveform shown in FIG. 3, for example, is applied to the upper electrode 21. Plasma is thus generated.

On the other hand, high frequency power having a certain waveform is applied to the lower electrode 5 by the oscillator 51. High frequency power having a frequency same as or lower than the lower one of ion transit frequencies characteristic of $CF_4$ and $O_2$ gases is applied to the lower electrode 5. High frequency power having a waveform shown in FIG. 4, for example, is applied to the lower electrode. Ions in plasma are thus accelerated and drawn to the wafer W, passing through the plasma sheath, to thereby act on the wafer W.

The high frequency by which plasma is generated has the waveform shown in FIG. 3 in this case. Therefore, the dissociation of gases introduced into the process chamber 2 is not advanced to an extent greater than needed. In addition, the frequency of 800 kHz by which ions in plasma are accelerated and drawn to the wafer W can be controlled in phase by the phase controller 52. Ions can be thus drawn to the wafer W before the dissociation of gases progresses to the extent greater than needed. When ions most suitable for etching are generated, therefore, they can be made incident onto the wafer W. When they are caused to act on the wafer W while cooling it, therefore, anisotropic etching having a high aspect rate can be realized.

The phase control of the high frequency power (frequency: 800 kHz) applied to the lower electrode may be based on a state under which the dissociation of gases does not progress to the extent greater than needed or a state under which the dissociation of gases progresses to the final stage, they are then combined again and become radicals suitable for etching.

Further, it may be arranged that a dummy wafer DW is used and that the treatment is carried out while confirming the extent to which the phase of the high frequency 800 kHz is shifted. The timing at which the phase of the high frequency 800 kHz is shifted may be previously set in this case, depending upon kinds of process gases, etching, coating and the like.

When the end point of anisotropic etching is detected (step S5), exhaust, process gas introducing and plasma control steps S6, S7 and S8 are successively carried out to isotropically etch film on the wafer W. The exhaust step S6 is substantially same as the above-described one S2. At the process gas introducing step S7, $C_4F_8$, $CHF_3$, Ar and CO gases, for example, different from those at the above-described step S3, are supplied to the process chamber 2.

At the plasma control step S8, plasma is controlled substantially as seen at the above-described step S4. When the end point of isotropic etching is detected (step S9), the applying of the high frequency power is stopped and the process chamber 2 is exhausted while supplying nitrogen gas into it (step S10). The gate valve 42 is opened and the wafer W is carried from the process chamber 2 into the load lock chamber 43 (step S11).

Referring to FIG. 5, the plasma control steps S4 and S8 will be described in more detail.

FIG. 5 is a graph showing ion transit frequency zones characteristic of three kinds of gases A, B and C, in which frequencies are plotted on the vertical axis. An ion transit frequency zone Az of gas A extends from an upper end Au to a lower end Al, an ion transit frequency zone Bz of gas B from an upper end Bu to a lower end Bl, and an ion transit frequency zone Cz of gas C from an upper end Cu to a lower end Cl. $CHF_3$ or CO gas is cited as gas A. Ar gas is cited as gas B. $CF_4$, $C_4F_8$ or $O_2$ gas is cited as gas C. At least one or more gases selected from the group consisting of $CF_4$, $C_4F_8$, $CHF_3$, Ar, $O_2$ and CO gases are used as process gas. In short, process gas may be one of them or one of mixed gases ($CH_3$+Ar+$O_2$), ($CHF_3$+CO+$O_2$), ($C_4F_8$+Ar+$O_2$), ($C_4F_8$+CO+Ar+$O_2$) and ($CF_4$+$CHF_3$).

When mixed gases of A, B and C are used as process gas, the high frequency power applied to the upper electrode has a frequency higher than the highest one Bu of upper ion transit frequencies Au, Bu and Cu and the high frequency power applied to the lower electrode has a frequency lower than the lowest one Cl of lower ion transit frequencies Al, Bl and Cl.

Another etching treatment method conducted using the above-described etching treatment apparatus 1 will be described.

The switches $SW_1$ and $SW_2$ are closed or turned on to connect the signal transmission circuits to their earthed circuits. High frequency signal (frequency: 800 kHz) is amplified directly by the amplifier 53, bypassing the phase controller 52, and applied to the susceptor 5 through the matching unit 54. On the other hand, high frequency signal (frequency: 27 MHz) is amplified directly by the amplifier 63, bypassing the amplitude modulator 62, and applied to the upper electrode 21 via the matching unit 64 and the feeder rod 65.

Conventionally, the matching unit arranged on the side of the susceptor is matched relative to the high frequency of 800 kHz but it becomes high in impedance relative to the high frequency of 27 MHz applied from the upper electrode, thereby making it difficult for the high frequency applied from the upper electrode to flow to the susceptor. Plasma is thus scattered, so that the plasma density decreases.

In the apparatus 1, however, the capacitance 56 is arranged between the feeder rod and the ground. A DC resonance circuit can be thus formed relative to the high frequency applied from the upper electrode. When the value of the capacitance 56 is adjusted, considering the constant of a distributed constant circuit, therefore, composite impedance can be made smaller than several Ω to thereby make it easy for the high frequency applied from the upper electrode to flow to the susceptor 5. Therefore, current density can be raised and plasma density thus attained can also be raised.

On the other hand, the capacitance 66 and the inductance 67 are attached to the feeder rod 65 arranged on the side of the upper electrode 21. Therefore, a DC resonance circuit is also provided relative to the high frequency of 800 kHz, thereby making it easy for the high frequency 800 kHz applied to the side of the susceptor 5 to flow to the upper electrode 21. The incidence of ions in plasma onto the wafer W is promoted accordingly.

Although high frequency power having the frequency 27 MHz has been applied to the upper electrode 21 and high frequency power having the frequency 800 kHz to the lower electrode 5 in the above-described embodiment, other frequencies may be set, depending upon kinds of process gas.

It is desirable that high frequency power applied to the lower electrode 5 has a frequency lower than the inherent lower ion transit frequency or lower than 1 MHz and that high frequency power applied to the upper electrode 21 has a frequency higher than the inherent upper ion transit frequency or higher than 10 MHz. When so arranged, ions are more efficiently accelerated with a smaller high frequency power and the follow-up of ions in the plasma sheath to bias frequencies becomes stable even when the rate of gases mixed and the degree of vacuum in the process chamber are a little changed. Therefore, ions can be made incident onto the wafer without scattering in the plasma sheath, thereby enabling a finer work to be achieved at high speed.

According to the present invention, the follow-up of ions is more excellent due to the high frequency power applied to he first electrode and they can be more efficiently accelerated with a smaller power. In addition, plasma itself can be kept stable. A more stable treatment can be thus realized even when the degree of vacuum in the process chamber and the rate of gases mixed change.

Further, when the dissociation is controlled not to progress to the extent greater than needed and the phase of the high frequency power applied to the first electrode is also controlled, ions or radicals needed for the treatment can be created at a desired timing and they can be made incident onto the wafer. Anisotropic etching treatment having a high aspect rate can be thus attained. In addition, damage applied to the wafers can be reduced. Further, plasma density can be made high without raising the high frequency power and its frequency, and ion control can be made easier.

A second embodiment will be described referring to FIG. 6. Same components as those in the above-described first embodiment will be mentioned only when needed.

An etching treatment apparatus 100 has, as high frequency power applier means, two high frequency power supplies 141, 151 and a transformer 142. The primary side of the transformer 142 is connected to the first power supply 141 and then earthed. Its secondary side is connected to both of the upper and lower electrodes 21 and 105. A first low pass filter 144 is arranged between the secondary side and the upper electrode 21 and a second low pass filter 145 between the secondary side and the lower electrode 105. The first power supply 141 serves to apply high frequency power having the relatively low frequency such as 380 kHz to the electrodes 105 and 21. When silicon oxide ($SiO_2$) film is to be etched, it is optimum that a frequency $f_0$ of high frequency power applied from the first power supply 141 is 380 kHz and when polysilicon (poly-Si) film is to be etched, it is preferably in a range of 10 kHz–5 MHz.

The transformer 142 has a controller 143, by which the power of the first power supply 141 is distributed to both electrodes 105 and 21 at an optional rate. For example, 400 W of full power 1000 W can be applied to the suscepter 105 and 600 W to the upper electrode 21. In addition, high frequency powers whose phases are shifted from each other by 180° are applied to the suscepter 105 and the upper electrode 21.

The second power supply 151 serves to apply high frequency power having the high frequency such as 13.56, for example, to the upper electrode 21. It is connected to the upper electrode 21 via a capacitor 152 and then earthed. This plasma generating circuit is called P mode one. It is optimum that a frequency $f_1$ of high frequency power applied from it is 13.56 MHz, preferably in a range of 10–100 MHz.

It will be described how silicon oxide film ($SiO_2$) on the silicon wafer W is etched by the above-described etching apparatus 100.

The wafer W is mounted on the suscepter 105 and sucked and held there by the electrostatic chuck 11. The process chamber 102 is exhausted while introducing $CF_4$ gas into it. After its internal pressure reaches about 10 mTorr, high frequency power of 13.56 MHz is applied from the second power supply 151 to the upper electrode 21 to make $CF_4$ gas into plasma and dissociate gas molecules between the upper electrode 21 and the suscepter 105. On the other hand, high frequency power of 380 kHz is applied from the first power supply 141 to the upper and lower electrodes 21 and 105. Ions and radicals such as fluoric ones in plasma-like gas molecules are thus drawn to the suscepter 105, thereby enabling silicon oxide film on the wafer to be etched.

The generating and keeping of plasma itself are attained in this case by the high frequency power having a higher frequency and applied from the second power supply 151. Stable and high density plasma can be thus created. In addition, activated species in this plasma are controlled by the high frequency power of 380 kHz applied to the upper and lower electrodes 21 and 105. Therefore, a more highly selective etching can be applied to the wafer W. Ions cannot follow up to the high frequency power which has the frequency of 13.56 MHz and by which plasma is generated. Even when the output of the power supply 151 is made large to generate high density plasma, however, the wafers W cannot be damaged.

The first and second low pass filters 144 and 145 are arranged on the secondary circuit of the transformer 142. This prevents the high frequency power having the frequency of 13.56 MHz and applied from the second power supply 151 from entering into the secondary circuit of the transformer 142. Therefore, the high frequency power having the frequency of 13.56 MHz does not interfere with the one having the frequency of 380 kHz, thereby making plasma stable. Blocking capacitors may be used instead of the low pass filters 144 and 145. Although high frequency powers have been continuously applied to the electrodes in the above case, modulation power which becomes strong and weak periodically may be applied to the electrodes 21 and 105.

Figure 7:
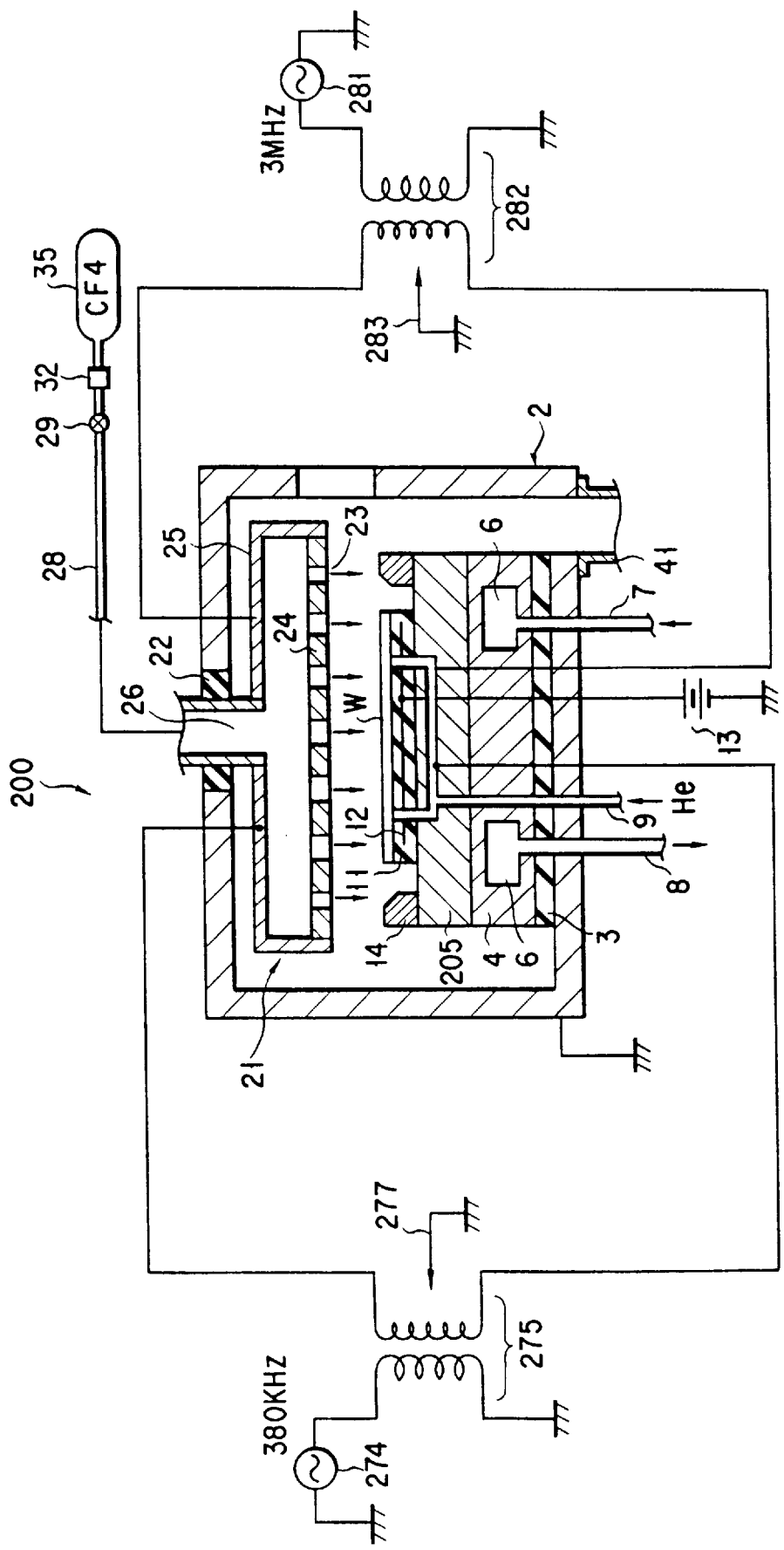
FIG. 7 is a block diagram showing the plasma etching apparatus according to a further embodiment of the present invention.

A third apparatus 200 will be described with reference to FIG. 7. Same components as those in the above-described first and second embodiments will be mentioned only when needed.

A high frequency power circuit of this apparatus 200 is different from that of the second embodiment in the following points: A suscepter 205 of the apparatus 200 is not earthed; no low pass filter is arranged on the secondary circuit of a transformer 275; and a second transformer 282 is arranged on the circuit of a second power supply 281.

The second power supply 281 serves to generate high frequency power of 3 MHz, It is connected to the primary side of the transformer 282, whose secondary side are connected to upper and lower electrodes 21 and 205. A controller 293 which controls the distribution of power is also attached to the secondary side of the transformer 282.

It will be described how the etching treatment is carried out by the apparatus 200.

High frequency powers of 3 MHz whose phases are shifted from each other by 180° are applied from the power supply 281 to the suscepter 205 and the upper electrode 21 to generate plasma between them. At the same time, high frequency powers of 380 kHz whose phases are shifted from each other by 180° are applied from a power supply 274 to them. Ions in plasma generated are thus accelerated to enter into the wafer W.

Further, the two high frequency power supplies 274 and 281 in the third apparatus are arranged independently of the other. In short, they are of the power split type. Therefore, they do not interfere with each other, thereby enabling a more stable etching treatment to be realized.

Furthermore, high frequency powers are supplied from the two power supplies 274 and 281 to both of upper and lower electrodes 21 and 205, respectively. The flow of current can be thus concentrated on a narrow area between the upper 21 and the lower electrode 205. As the result, a high density plasma can be generated and the efficiency of controlling ions in plasma can be raised.

A fourth embodiment will be described, referring to FIGS. 8 through 12. Same components as those in the above-described embodiments will be mentioned only when needed.

Figure 8:
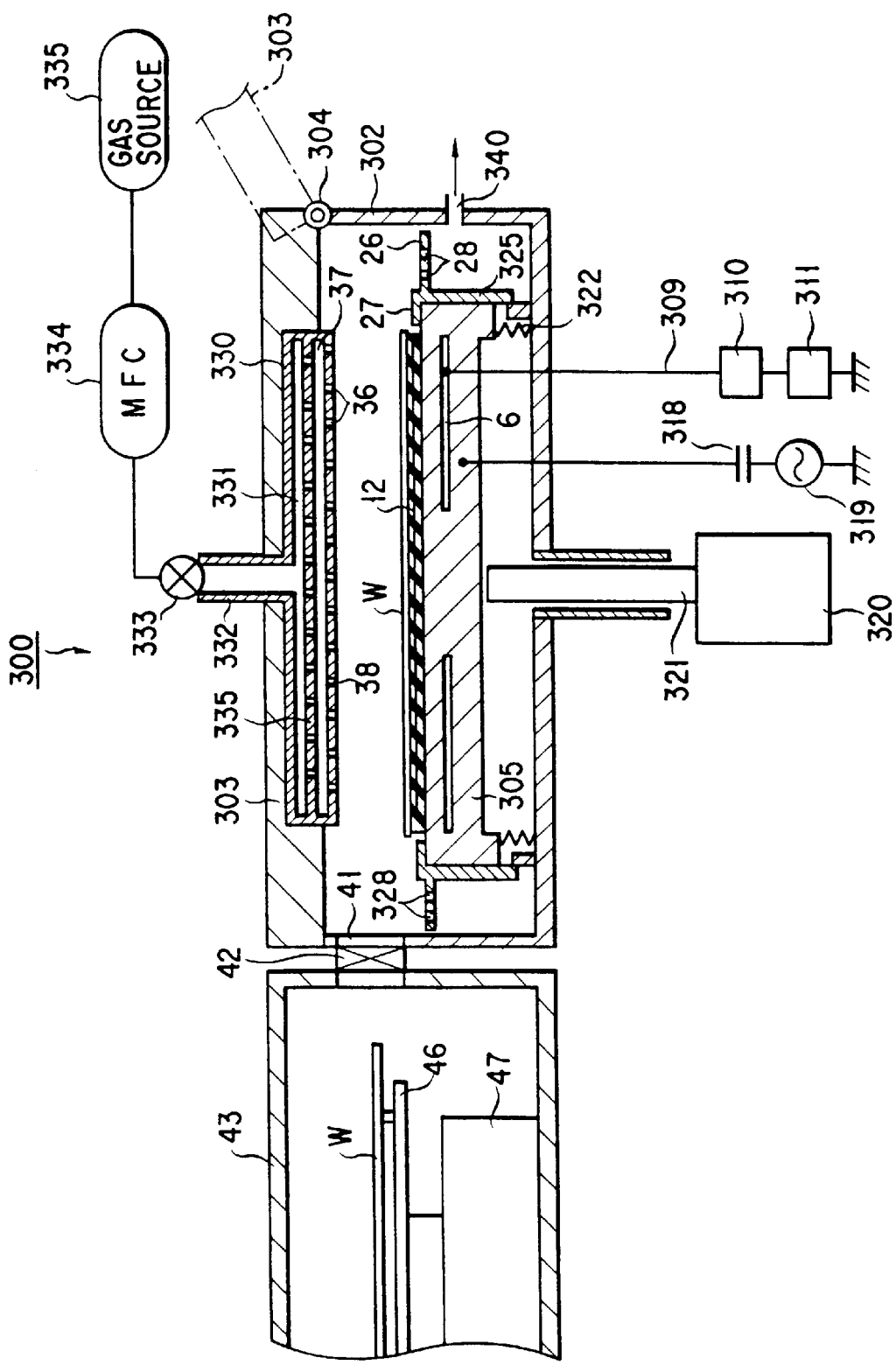
FIG. 8 is a block diagram showing the plasma etching apparatus according to a still further embodiment of the present invention.

As shown in FIG. 8, an etching apparatus 300 has a cylindrical or rectangular column-like air-tight chamber 302. A top lid 303 is connected to the side wall of the process chamber 302 by hinges 304. Temperature adjuster means such as a heater 306 is arranged in a suscepter 305 to adjust the treated face of a treated substrate W to a desired temperature. The heater 306 is made, for example, by inserting a conductive resistance heating unit such as tungsten into an insulating sintered body made of aluminium nitride. Current is supplied to this resistant heating unit through a filter 310 to control the temperature of the wafer W in such a way that the treated face of the wafer W is raised to a predetermined temperature.

A high frequency power supply 319 is connected to the suscepter 305 through a blocking capacitor 318. When the wafer W is to be etched, the high frequency power of 13.56 MHz is applied from the power supply 319 to the suscepter 305.

The suscepter 305 is supported by a shaft 321 of a lifter mechanism 320. When the shaft 321 of the lifter mechanism 320 is extended and retreated, the suscepter 305 is moved up and down. A bellows 322 is attached to the lower end of the suscepter 305 not to leak gases in the process chamber 302 outside.

Reaction products deposit in the process chamber 302. A ring 325 is freely detachably attached to the outer circumference of the suscepter 305. It is made preferably of PTFE (teflon), PFA, polyimide or PBI (polybenzoimidazole). It may also be made of such a resin that has insulation in a temperature range of common temperature −500° C. or of such a metal like aluminium that has insulating film on its surface. A baffle plate 326 is made integral to it. A plurality of holes 328 are formed in the baffle plate 326. They are intended to adjust the flow of games in the process chamber 302, to make its exhaust uniform, and to make a pressure difference between the treatment space and a space downstream the flow of gases. A top portion 327 of the ring 325 is bent inwards, extending adjacent to the electro-static chuck 11, to make the top of the susceptor 305 exposed as small as possible.

An upper electrode 330 is arranged above the susceptor 305. When the etching treatment is to be carried out, the susceptor 305 is lifted to adjust the interval between the susceptor 305 and the upper electrode 330. The upper electrode 330 is made hollow and a gas supply pipe 332 is connected to this hollow portion 331 to introduce $CF_4$ gas and others from a process gas supply supply 333 into the hollow portion 331 through a mass flow controller (MFC) 334. A diffusion plate 335 is arranged in the hollow portion 331 to promote the uniform diffusion or scattering of process gases. Further, a process gas introducing section 337 having a plurality of apertures 336 is arranged under the diffusion plate 335. An exhaust opening 340 which is communicated with an exhaust system provided with a vacuum pump and others is formed in the side wall of the process chamber 302 at the lower portion thereof to exhaust the process chamber 302 to an internal pressure of 0.5 Torr, for example.

When the wafer W is etched in the process chamber 302, reaction products are caused and they adhere to the ring 325 and the baffle plate 326, leaving the outer circumference of the susceptor 305 substantially free from them. When the etching treatment is finished, the wafer W is carried out of the process chamber 302 into the load lock chamber 43. A next new wafer W is then carried from the load lock chamber 43 into the process chamber 302 and etched in it. When this etching treatment is repeated many times, a lot of reaction products adhere to the ring 325.

Figure 9:
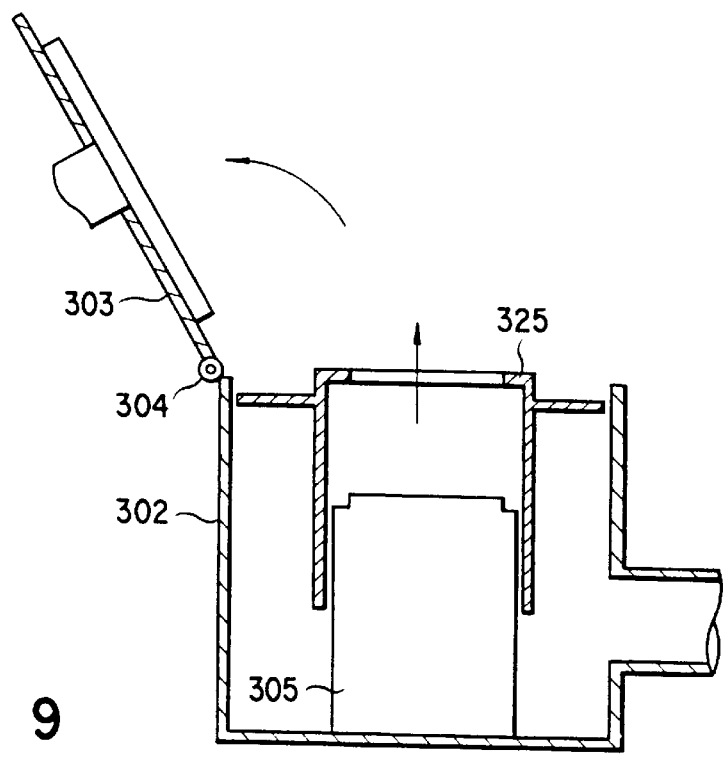
FIG. 9 is a vertically-sectioned view showing a housing and a ring member of the plasma etching apparatus.

As shown in FIG. 9, the top lid 303 of the process chamber 302 is opened and the ring 325 is detached from the susceptor 305. Reaction products are then removed from the ring 325 by cleaning.

The time at which the ring 325 must be cleaned is determined as follows:
the number of particles adhering to the wafer W which has been treated by the apparatus 300 is counted and when it becomes larger than a predetermined value;
the number of particles scattering in the atmosphere exhausted from the apparatus 300 and/or at least in one or more areas in the exhaust pipe is counted and when it becomes larger than a predetermined value;
when predetermined sheets of the wafer W have been treated in the apparatus 300; and
when the total of hours during which plasma has been generated or the plasma treatment has been carried out reaches a predetermined value.

Figure 10:
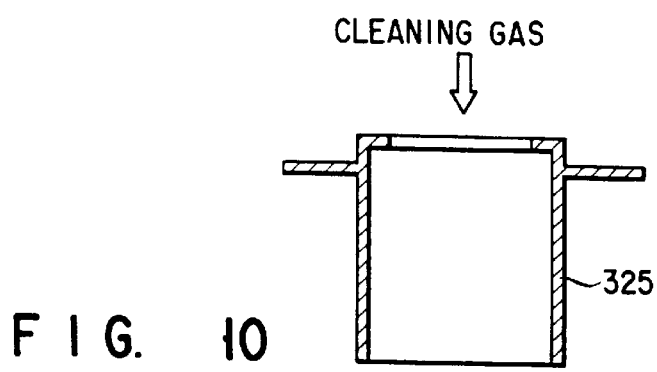
FIG. 10 is a vertically-sectioned view showing the ring member being cleaned.

Dry or wet cleaning is used. The dry cleaning is carried out in such a way that $ClF_3$, $CF_4$ or $NF_3$ gas is blown to the ring 325 which is left attached to the susceptor 305 or which is detached from the susceptor 305 and left outside the process chamber 302, as shown in FIG. 10.

Figure 11:
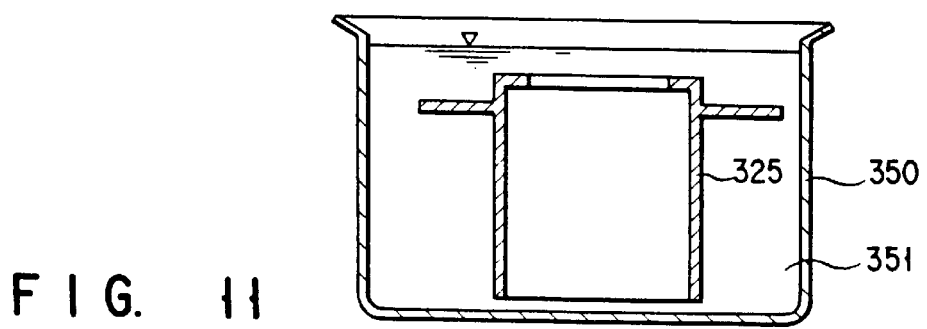
FIG. 11 is a vertically-sectioned view showing the ring member being cleaned.

On the other hand, the wet cleaning is carried out in such a way that the ring 325 to which reaction products have adhered is immersed in cleaning liquid 351 in a container 350, as shown in FIG. 11. IPA (isopropyl alcohol), water or fluorophosphoric acid is used as cleaning liquid 351. The ring 325 from which reaction products have been removed by the dry or wet cleaning is again attached to the susceptor 305 and the plasma treatment is then repeated.

When the wafers W are to be etched, plural rings 325 are previously prepared relative to one susceptor 305. If so, cleaned one can be attached to the susceptor 305 while cleaning the other.

The dry or wet cleaning can be appropriately used to remove reaction products from the ring 325. When the dry cleaning is compared with the wet one, however, the former is easier in carrying out it but its cleaning is more incomplete. To the contrary, the latter is more excellent in cleaning the ring 325 but its work is relatively more troublesome. Therefore, it is desirable that the wet cleaning is periodically inserted while regularly carrying out the dry cleaning.

The baffle plate will be described referring to FIGS. 12 and 13.

As shown in FIG. 12, it is preferable that an effective diameter $D_1$ is set not larger than a diameter $D_2$. The effective diameter $D_1$ represents a diameter of that area where the process gas jetting apertures 336 are present, and the diameter $D_2$ denotes that of the wafer W in this case. When the effective diameter $D_1$ is set in this manner, a high efficient etching can be attained in the process chamber 302. It is the most preferable that the effective diameter $D_1$ is set to occupy about 90% of the diameter $D_2$.

Providing that the underside 338 of the upper electrode has a diameter $D_3$, the effective diameter $D_1$, the diameter $D_2$ and the diameter $D_3$ meet the following inequality (1).

$$D_1 < D_2 < D_3 \tag{1}$$

When the ring the whole of which is made of insulating material is used as it is, the effective area of the lower electrode becomes substantially smaller than that of the upper electrode, thereby making plasma uneven. This problem can be solved when the effective area of the lower electrode is made same as that of the upper electrode or when it is made larger than that of the upper electrode.

As shown in FIG. 13, the baffle plate 326 is made integral to the ring 325. It is divided into a portion 360 equal to the diameter $D_4$ and another portion 361 larger than it, and the inner portion 360 is made of metal such as alminium and stainless steel while the outer portion 361 of PTFE (teflon), PEA, polyimide, PBI (polybenzoimidazole), other insulating resin or alumite-processed aluminium.

The diameter $D_4$ is made same as or larger than the diameter $D_3$. At least the inner portion 360 of the baffle plate 326 is positioned just under the upper electrode 330. The ring 326 is divided into an upper half 363 and a lower half 364, sandwiching an insulator 362 between them. The upper half 363 is made of metal such as aluminium and stainless steel and it is made integral to the inner portion 360 of the baffle plate 326. A power supply 319 which serves to apply high frequency power to the susceptor 305 is connected to these inner portion 360 of the baffle plate 326 and upper half 363 of the ring 325 by a lead 367 via a blocking capacitor 318. At least those portions (the inner portion 360 of the baffle plate and the upper half 363 of the ring) which are positioned just under the upper electrode 330 are made same in potential. In order to make it easy to exchange the ring 325, it is preferable that the lead 367 is connected to the upper half 363 of the ring or the inner portion 360 of the baffle plate 326 by an easily-detached socket 368. A lower susceptor 365 is insulated from the upper one 305 by an insulating layer 366. The lower half 364 of the ring is also therefore insulated from the upper half 363 thereof by the insulator 362.

When at least that portion of the baffle plate 326 which is positioned just under the upper electrode 330 is made same in potential as the suscepter 305, as described above, plasma can be made uniform.

Figure 14:
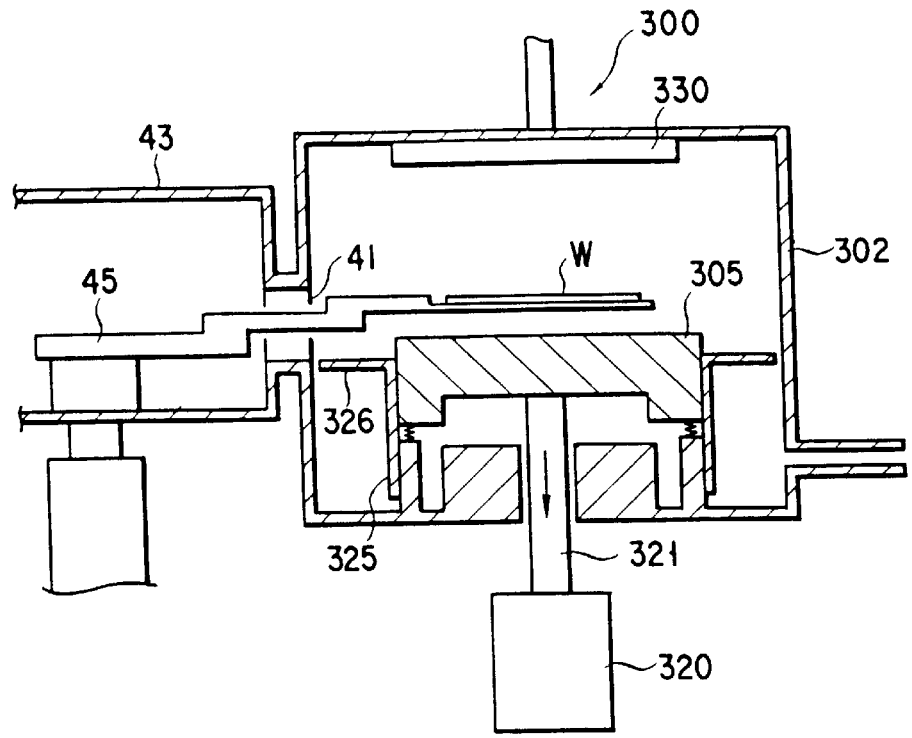
FIG. 14 is a vertically-sectioned view showing the plasma etching apparatus when the suscepter is lowered.
Figure 15:
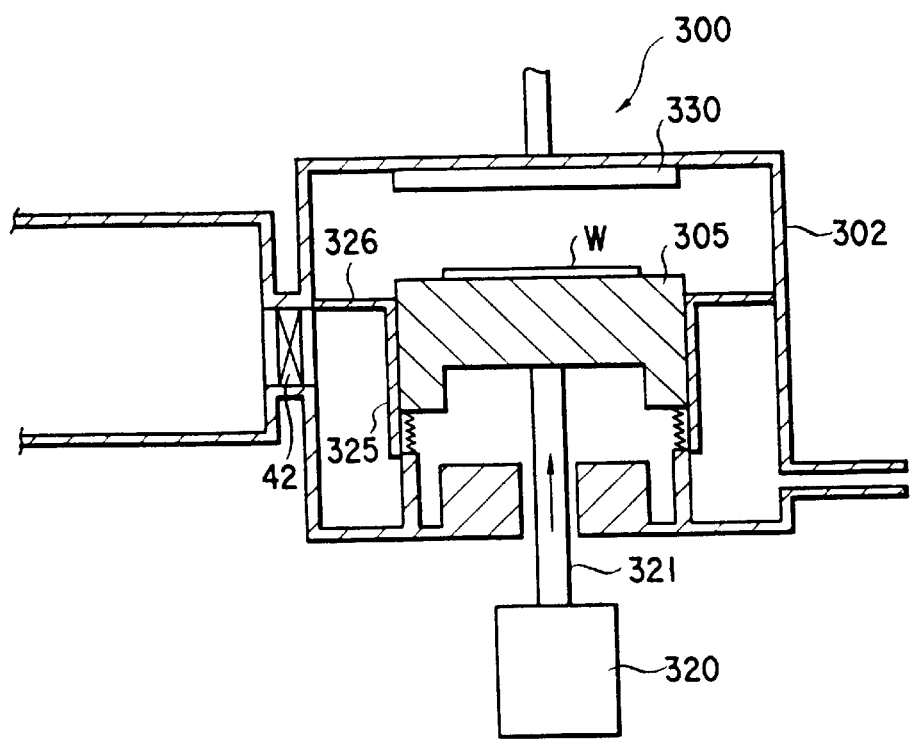
FIG. 15 is a vertically-sectioned view showing the plasma etching apparatus when the suscepter is lifted.

Referring to FIGS. 14 and 15, it will be described how the side opening 41 of the process chamber 302 through which the wafer W is carried in and out is opened and closed as the suscepter is moved up and down.

The ring 325 provided with the baffle plate 326 encloses the suscepter 305. The lifter means 320 is arranged under the process chamber 302 and the suscepter 305 is supported by the shaft 321 of the lifter means 320.

When the suscepter 305 is moved down, as shown in FIG. 14, the baffle plate 326 is positioned lower than the side opening 41. When it is moved up, as shown in FIG. 15, the baffle plate 326 is positioned higher than the side opening 41.

When the suscepter 305 is moved down and the baffle plate 326 is positioned lower than the side opening 41, therefore, the wafer W can be freely carried in and out of the process chamber 302 through the side opening 41. When the baffle plate 326 is positioned higher than the side opening 41 at the time of etching treatment, however, the side opening 41 is shielded from the process space between the upper and the lower electrode, thereby preventing plasma from entering into the side opening 41.

Figure 16:
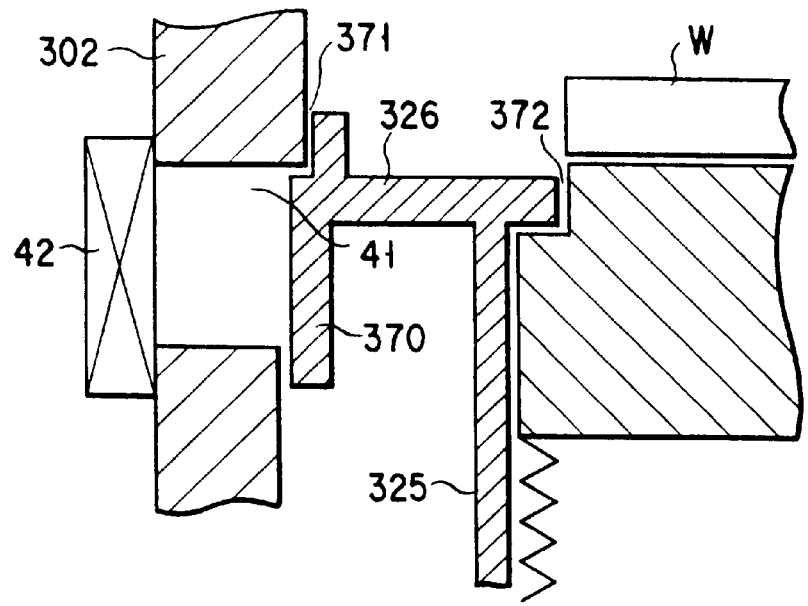
FIG. 16 is a partly-sectioned view showing a wafer carry-in and -out gate and a baffle member.

As shown in FIG. 16, it may be arranged that a shielding plate 370 is attached to the outer circumference of the baffle plate 326 and that the side opening 41 is closed by the shielding plate 370 when the suscepter 305 is moved up. Particularly, the side opening 41 is too narrow for hands to be inserted. Therefore, inert gas may be supplied, as purge gas, into a clearance 371 between the shielding plate 370 and the inner face of the process chamber 302 not to is cause process gases to enter into the side opening 41. Similarly, purge gas may also be supplied into a clearance 372 between the wafer-mounted stage 305 and the upper half 363 of the ring 325.

Figure 17:
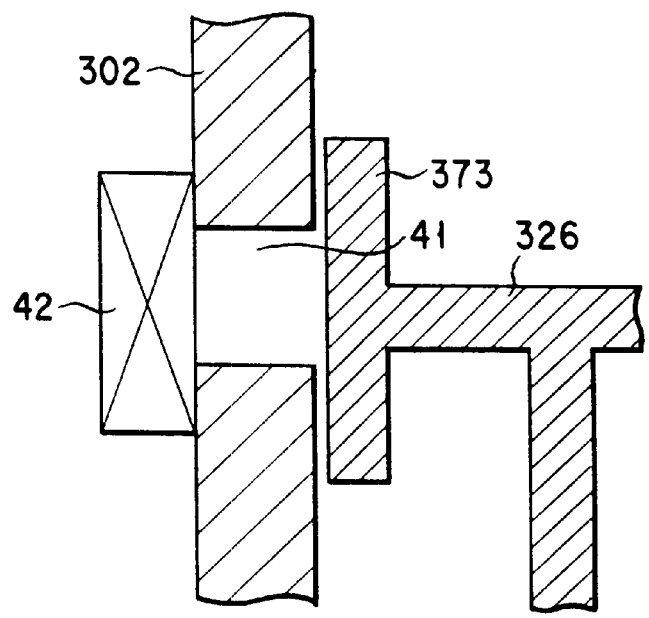
FIG. 17 is a partly-sectioned view showing the wafer carry-in and -out gate and another baffle member.
Figure 18:
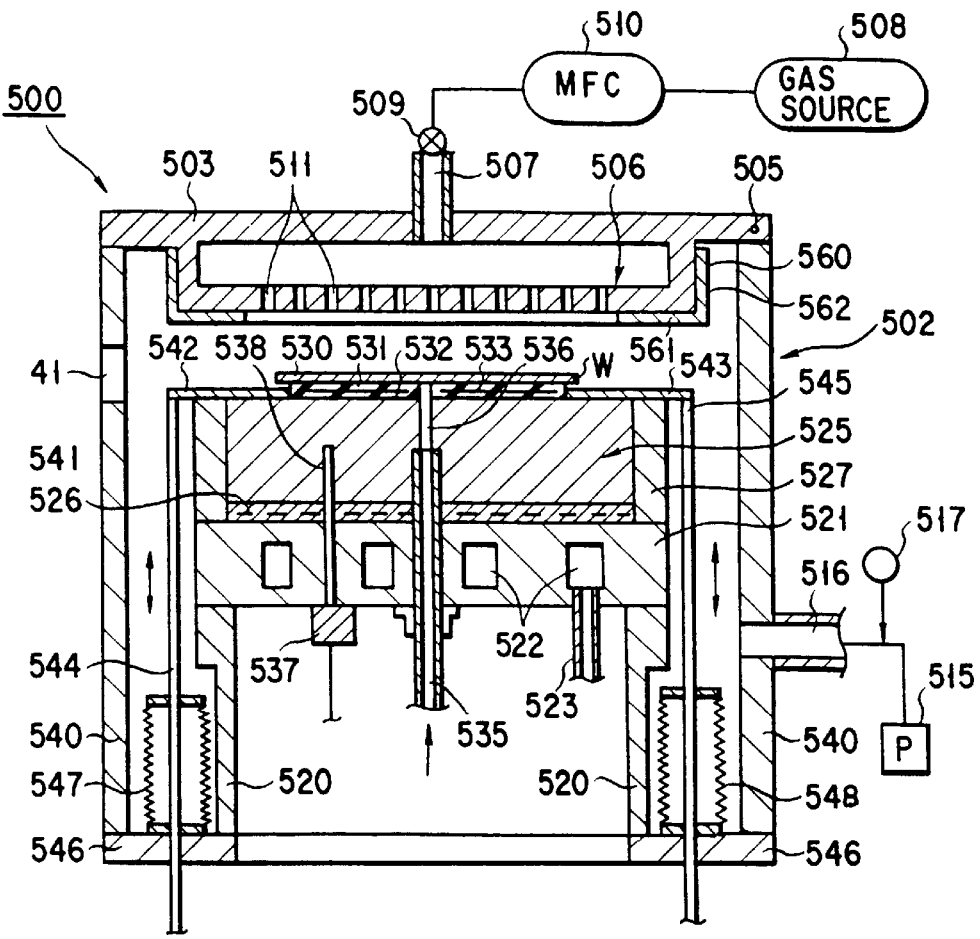
FIG. 18 is a block diagram showing the plasma etching apparatus according to a still further embodiment of the present invention.

The side opening 41 may be closed by a shielding plate 373 attached to the outer circumference of the baffle plate 326, as shown in FIG. 17, when the baffle plate 326 is lifted half the side opening 41.

Referring to FIGS. 18 through 28, the cleaning of a fifth CVD apparatus will be described. Same components as those in the above-described embodiments will be mentioned only when needed.

A CVD apparatus 500 has a process chamber 502 which can be exhausted vacuum. A top lid 503 is connected to the side wall of the process chamber 502 by hinges 505. A shower head 506 is formed in the center portion of the top lid 503 at the underside thereof. A process gas supply pipe 507 is connected to the top of the shower head 506 to introduce mixed gases ($SiH_4+H_2$) from a process gas supply 508 into the shower head 506 through a mass flow controller (MFC) 510. A plurality of gas jetting apertures 511 are formed in the bottom of the shower head 506 and process gases are supplied to the wafer W through these apertures 511.

An exhaust pipe 516 which is communicated with a vacuum pump 515 is connected to the side wall of the process chamber at the lower portion thereof. A laser counter 517 which serves to count the number of particles contained in the gas exhausted from the process chamber 502 is attached to the exhaust pipe 516. The process chamber 502 is decompressed to about $10^{-6}$ Torr by the exhaust means 515.

The process chamber 502 has a bottom plate 521 supported by a substantially cylindrical support 520 and cooling water chambers 522 are formed in the bottom plate 521 to circulate cooling water supplied through a cooling water pipe 523 through them.

A suscepter 525 is mounted on the bottom plate 521 through a heater 526 and these heater 526 and the wafer-mounted stage 525 are enclosed by a heat insulating wall 527. The heat insulating wall 527 has a mirror-finished surface to reflect heat radiated from around. The heater 526 is heated to a predetermined temperature or 400–2000° C. by voltage applied from an AC power supply (not shown). The wafer W on the stage 525 is heated to 800° C. or more by the heater 526.

An electrostatic chuck 530 is arranged on the top of the wafer-mounted stage 525. It comprises polyimide resin films 531, 532 and a conductive film 533. A variable DC voltage supply (not shown) is connected to the conductive film 533.

A detector section 538 of a temperature sensor 537 is embedded in the suscepter 525 to successively detect temperature in the wafer-mounted stage 525. The power of the AC power supply which is supplied to the heater 526 is controlled responsive to signal applied from the temperature sensor 537. A lifter 541 is connected to the suscepter 525 through a member 543 to move it up and down. Those portions of a support plate 546 through which support poles 544 and 545 are passed are provided with bellows 547 and 548 to keep the process chamber 502 air-tight.

A cover 560 is freely detachably attached to the shower head 506. It is made of material of the PTFE (teflon) group, PFA, polyimide, PBI (polybenzoimidazole) or polybenzoazole, which are insulators and heat resistant. In the case of the plasma CVD apparatus, the wafer-mounted stage 525 is heated to about 350–400° C. at the time of plasma process and in the case of the heat CVD apparatus, it is usually heated higher than 650° C. or to about 800° C. The cover 560 is therefore made of such a material that can resist this radiation heat.

Figures 19, 20:
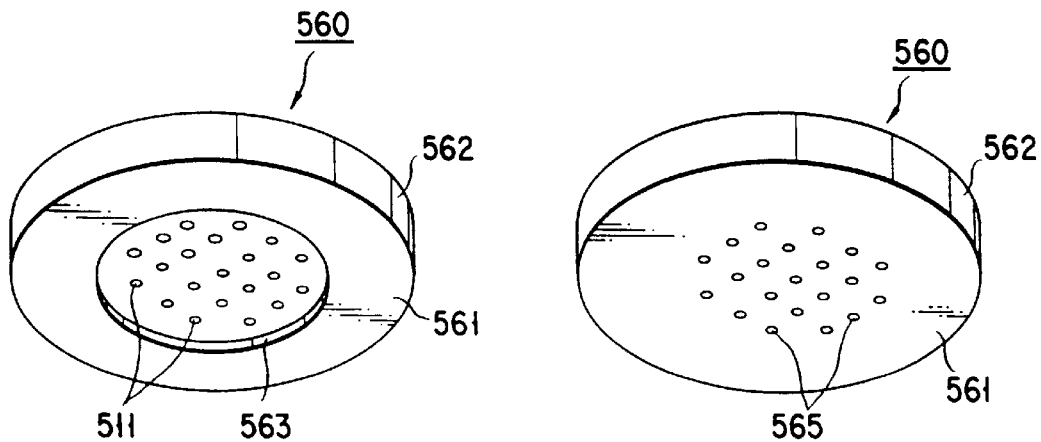
FIG. 19 is a perspective view showing a cover for the upper shower electrode.
FIG. 20 is a perspective view showing another cover for the upper shower electrode.

As shown in FIG. 19, a large-diameter opening 563 is formed in a bottom 561 of the cover 560. When the cover 560 is attached to the shower head 506, the gas jetting apertures 511 of the shower head 506 appear in the opening 563.

As shown in FIG. 20, a plurality of apertures 565 may also be formed in the cover 560. These apertures 565 are aligned with those of the shower head 506 in this case.

As shown in FIG. 21, recesses 570 may be formed in the outer circumference of the shower head 506 while claws 571 are formed on an inner circumference 562 of the cover 506, as shown in FIG. 22. The claws 571 are fitted into recesses 570 in this case while elastically deforming the cover 560. The three claws 571 are arranged on the inner circumference 562 of the cover 560 at a same interval, as shown in FIG. 22.

As shown in FIG. 23, the cover 560 may be attached to the shower head 506 in such a way that bolts 575 are screwed into recesses 573 of the shower head 506 through a cover side 562.

It will be described how upper electrode cover is cleaned.

Figure 24:
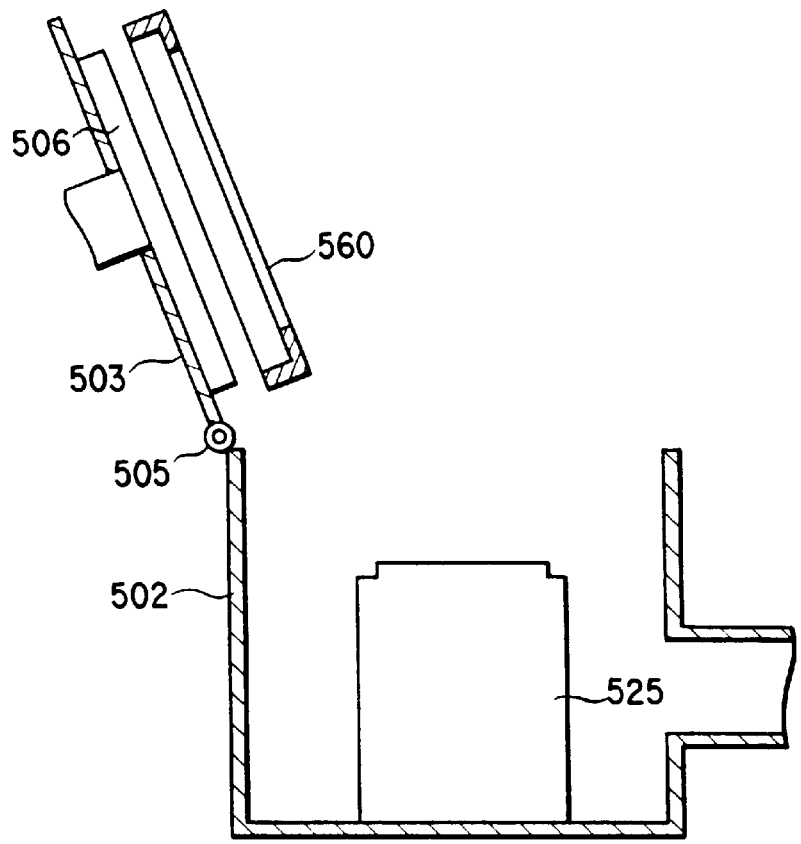
FIG. 24 shows how the cover is detached from the upper shower electrode.
Figure 25:
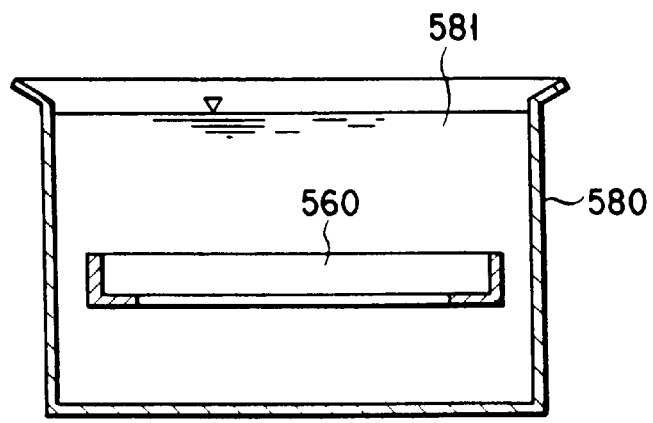
FIG. 25 is a sectional view showing the cover being cleaned.

When mixed gases ($SiH_4+H_2$), for example, are introduced into the process chamber 502 to form film on the wafer W, reaction products adhere to the upper electrode cover 560. As shown in FIG. 24, the top lid 503 is opened and the cover 560 is detached from the shower head 506. The cover 560 is then immersed in cleaning liquid 581 in a container 580 (wet cleaning). Or the dry cleaning may be conducted in such a way that cleaning gas such as $ClF_3$, $CF_4$ or $NF_3$ gas is introduced into the process chamber 502 while keeping the cover 560 attached to the shower head 506.

The time at which the cleaning must be conducted is determined as follows. The number of particles contained in the gas exhausted through the exhaust pipe 516 is counted by the counter 517 and when it becomes larger than a limit value, the cleaning of the cover 560 must be started.

Figure 26:
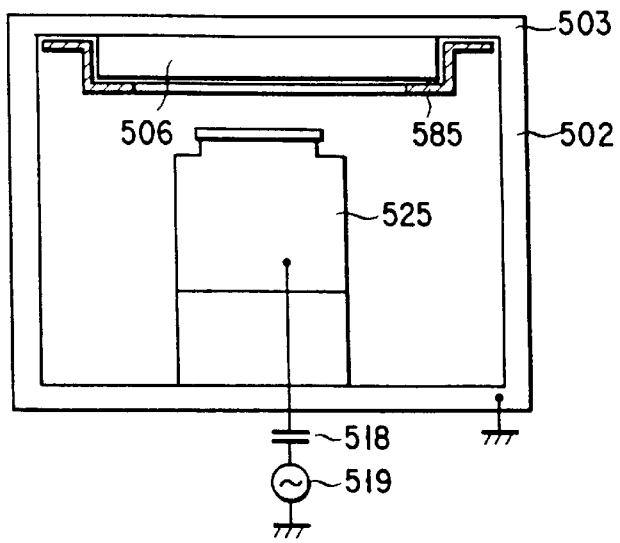
FIG. 26 is a sectional view showing a further cover.
Figure 27:
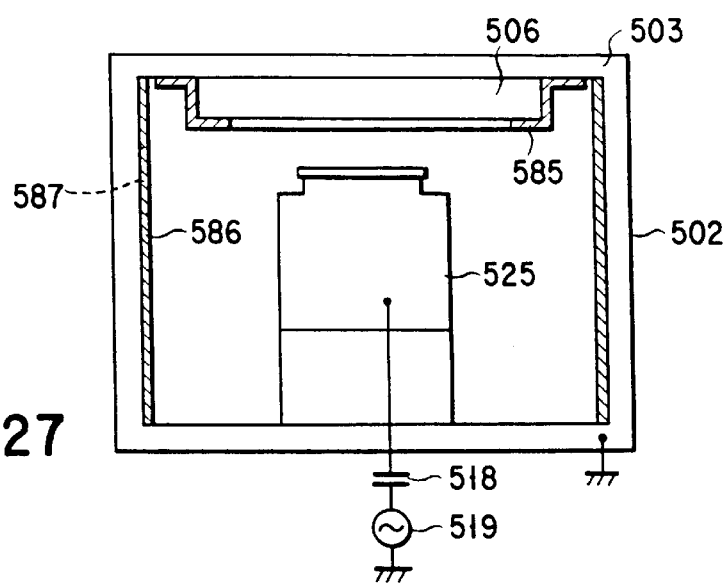
FIG. 27 is a sectional view showing a still further cover.
Figure 28:
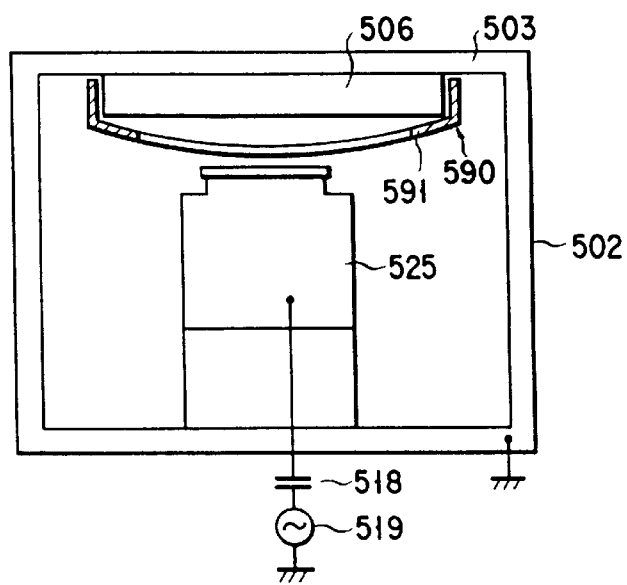
FIG. 28 is a sectional view showing a still further cover.

As shown in FIG. 26, the underside of the top lid 503 may be covered by a cover 585, in addition to the shower head 506. Or the inner face of the process chamber 502 may be covered by a cover 586, in addition to the shower head 506, as shown in FIG. 27. An opening 587 is formed in the cover 586 in this case, corresponding to the side opening 41 of the process chamber 502. Or a cover 590 having a curved bottom 591 may be used, as shown in FIG. 28.

A sixth embodiment will be described referring to FIGS. 29 through 34. Same components as those in the above-described embodiments will be mentioned only when needed.

Figure 29:
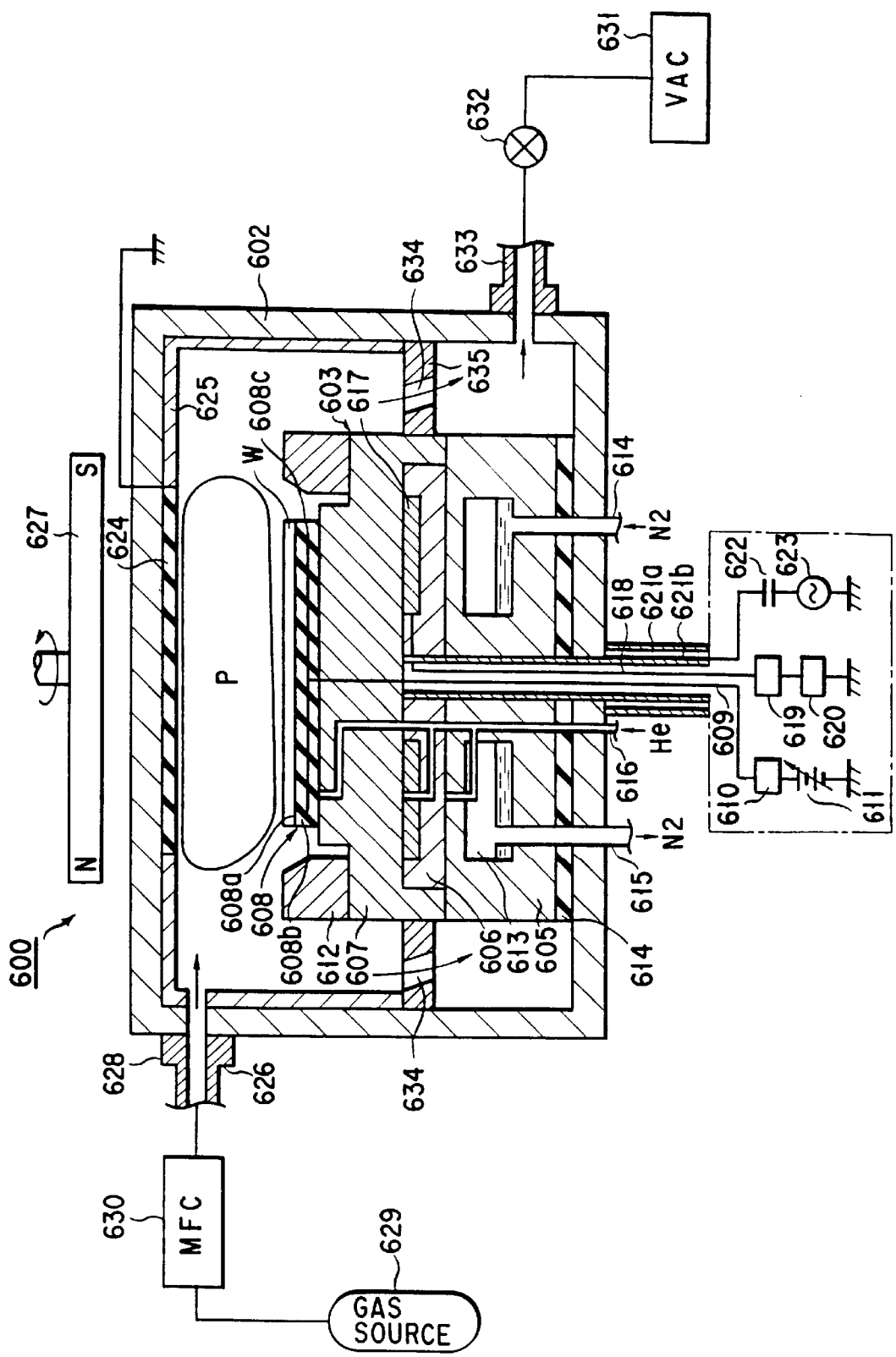
FIG. 29 is a block diagram showing a magnetron plasma etching apparatus in which plasma is being generated.

As shown in FIG. 29, a magnetron type plasma etching apparatus 600 has a rotary magnet 627 above a process chamber 602. Upper and lower electrodes 624 and 603 are opposed in the process chamber 602. Process gases are introduced from a gas supply supply 629 to the space between the upper and the lower electrode through an MPC 630. The rotary magnet 627 serves to stir plasma generated between both of the electrodes 603 and 624.

A suscepter assembly comprises an insulating plate 604, a cooling block 605, a heater block 606, an electrostatic chuck 608 and a focus ring 612. A conductive film 608c of the electrostatic chuck 608 is connected to a filter 610 and a variable DC high voltage supply 611 by a lead 609. The filter 610 is intended to cut high frequencies. An internal passage 613 is formed in the cooling block 605 and liquid nitrogen is circulated between it and a coolant supply supply (not shown) through pipes 614 and 615. A gas passage 616 is opened at tops of the suscepter 603, the heater 617 and the cooling block 605, passing through the suscepter assembly. The base end of the gas passage 616 is communicated with a heat exchanger gas supply supply (not shown) to supply heat exchanger gas such as helium gas to the underside of the wafer W through it. The heater block 606 is arranged between the suscepter 603 and the cooling block 605. It is shaped like a band-like ring and it is several mm thick. It is a resistant heating unit. It is connected to a filter 619 and a power supply 620.

Inner and outer pipes 621a and 521b are connected to the suscepter 603 and the process chamber 602. They are conductive double pipes, the outer one 621a of which is earthed and the inner one 621b of which is connected to a high frequency power supply 623 via a blocking capacitor 622. The high frequency power supply 623 has an oscillator for oscillating the high frequency of 13.56 MHz. Inert gas is introduced from a gas supply supply (not shown) into a clearance between the inner 621a and the outer pipe 621b and also into the inner pipe 621b.

Except the upper electrode, the inner faces of the top of the process chamber 602 is covered by an insulating protection layer 625, 3 mm or more thick. Similarly, the inner face of its side wall is covered by an insulating protection layer 626, 3 mm or more thick.

Figure 34:
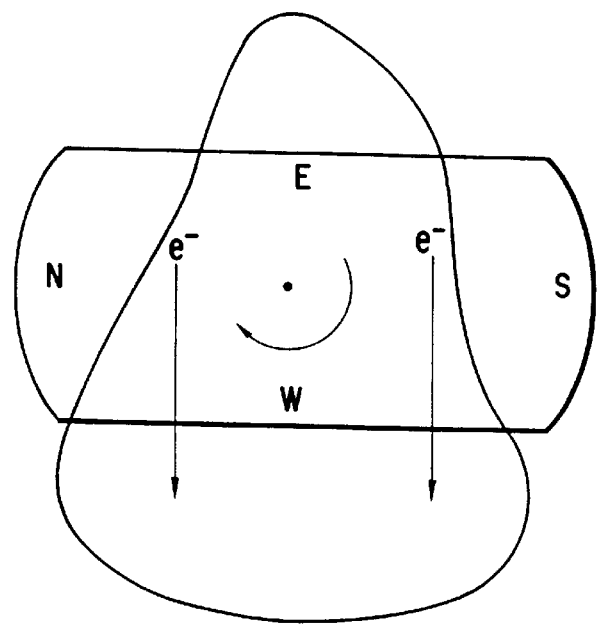
FIG. 34 is intended to explain the relation of the process chamber to magnetic field generated by a permanent magnet.

In the conventional magnetron type plasma etching apparatus, the flow of electrons tends to gather near the inner wall of the process chamber, as shown in FIG. 34. The flow of plasma is thus irradiated in a direction W, that is, to the side wall of the process chamber, thereby damaging it. In the above-described apparatus 600, however, the side wall of the process chamber 602 is covered by the insulating protection layer 626 so that it can be protected.

Process gas supply and exhaust lines or systems of the apparatus 600 will be described.

A process gas supply pipe 628 is connected to the side wall of the process chamber 602 at the upper portion thereof and $CF_4$ gas is introduced from a process gas supply 629 into the process chamber 602 through it. An exhaust pipe 633 is also connected to the side wall of the process chamber 602 at the lower portion thereof to exhaust the process chamber 602 by an exhaust means 631, which is provided with a vacuum pump. A valve 632 is attached to the exhaust pipe 633.

As shown in FIG. 30, a baffle plate 635 is arranged between the outer circumference of the suscepter 603 and the inner wall of the process chamber 602. Plural holes 634 are formed in the baffle plate 635 to adjust the flow of exhausted air or gas.

As shown in FIG. 31, each hole 634 is tilted. Therefore, the conductance of gas rises when it passes through the holes 634 and the gradient of electric field becomes gentle accordingly. This prevents discharge from being caused in the holes 634 and plasma from flowing inward under the baffle plate 635.

As shown in FIG. 32, holes 634a, 634b, 634c and 634d each having a same pitch may be formed in plural baffle plates 635a, 635b, 635c and 635d to form a step-like exhaust hole 634A. This exhaust hole 634A can be formed when the baffle plates 635a, 635b, 635c and 635d are placed one upon the others in such a way that the holes 634a, 634b, 634c and 634d are a little shifted from their adjacent ones. When these exhaust holes 634A are formed, abnormal discharges in plasma generation can be more effectively prevented.

Figure 33:
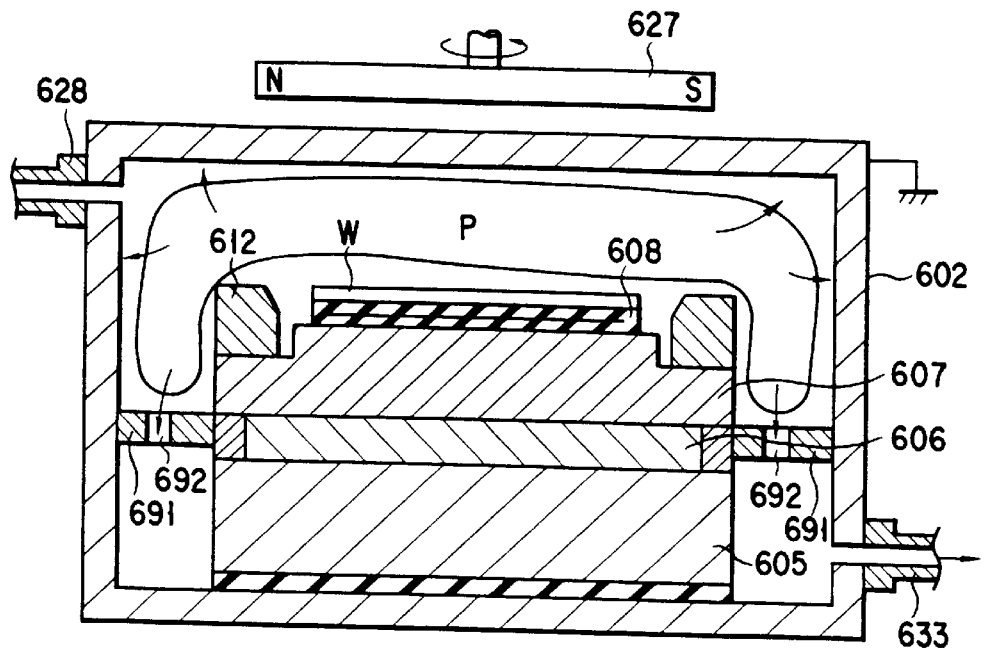
FIG. 33 shows plasma generated in the conventional apparatus.

In the conventional apparatus, each hole 692 in the baffle plate extends only vertical, as shown in FIG. 33. These holes 692 allow plasma to flow inward under the baffle plate and abnormal discharges such as sparkles to be caused in them, thereby causing metal contamination and particles. In the apparatus 600, however, the holes 634 are directed toward the exhaust opening 633. The reduction of exhaust speed can be thus prevented. When the direction in which the turbo-pump 631 is driven is made reverse to the flow of exhausted gas, that is, when it is made anticlockwise in a case where exhausted gas flows clockwise, the speed of exhausted gas can be raise to a further extent.

A seventh embodiment will be described referring to FIGS. 35 through 43. TEOS gas is used to form film on the wafer W in this seventh plasma CVD apparatus. Same components as those in the above-described embodiments will be mentioned only when needed.

The plasma CVD apparatus 700 has a cylindrical or rectangular process chamber 710, in which a suscepter 712 is arranged to hold a wafer W on it. It is made of conductive material such as aluminium and it is insulated from the wall of the process chamber 710 by an insulating member 714. A heater 716 which is connected to a power supply 718 is embedded in it. The wafer W on it is heated to about 300° C. (or film forming temperature) by the heater 716. The process chamber is of the cold wall type in this case, but it may be of the hot wall type. The process chamber of the hot wall type can prevent gas from being condensed and stuck.

The electrostatic chuck 11 is arranged on the suscepter 712. Its conductive film 12 is sandwiched between two sheets of film made of polybensoimidazole resin. A variable DC high voltage power supply 722 is connected to the conductive film 12. A focus ring 724 is arranged on the suscepter 712 along the outer rim thereof.

A high frequency power supply 728 is connected to the suscepter 712 via a matching capacitor 726 to apply high frequency power having a frequency of 13.56 MHz or 40.68 MHz to the suscepter 712.

An upper electrode 730 serves as a plasma generator electrode and also as a process gas introducing passage. It is a hollow aluminium-made electrode and a plurality of apertures 730a are formed in its bottom. It has a heater (not shown) connected to a power supply 731. It can be thus heated to about 150° C. by the heater.

A process gas supply line or system provided with a vaporizer (VAPO) 732 will be described referring to FIGS. 35 and 36.

Liquid TEOS is stored in a container 734. At the film forming process, a liquid mass flow controller (LMFC) 736 is controlled by a controller 758 to control is the flow rate of liquid TEOS supplied from the container 734 to the vaporizer 732.

Figure 36:
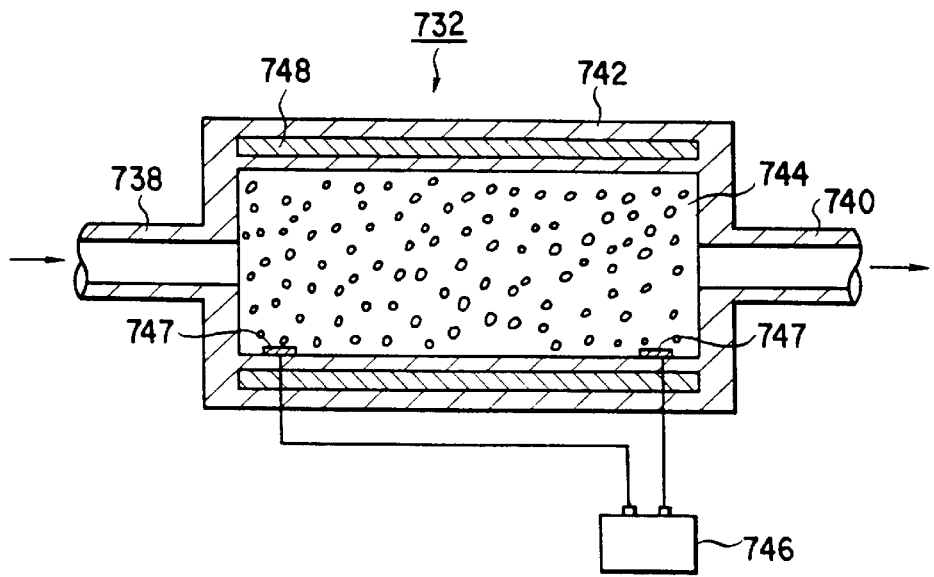
FIG. 36 is a block diagram showing the inside of a vaporizer.

As shown in FIG. 36, a porous and conductive heating unit 744 is housed in a housing 742 of the vaporizer 732. The housing 742 has an inlet 738 and an outlet 740. The inlet 738 is communicated with the liquid supply side of the container 734. The outlet 740 is communicated with the hollow portion of the upper electrode 730.

The heating unit 744 is made of sintered ceramics in which conductive material such as carbon is contained, and it is porous. It is preferably excellent in workability and in heat and chemical resistance. Terminals 747 are attached to it and current is supplied from a power supply 746 to it through them. When current is supplied to it, it is resistance-heated to about 150° C. Further, vibrators 748 are embedded in the housing 742, sandwiching the heating unit 744 between them. It is preferable that they are supersonic ones. The power supply 746 for the heating unit 744 and a power supply (not shown) for the vibrators 748 are controlled by the controller 758.

It will be described how the vaporizer 732 is operated.

When liquid TEOS is supplied from the container 734 to the vaporizer 732, it enters into holes in the porous heating unit 744 and it is heated and vaporized. Because its contact area with the porous heating unit 744 becomes extremely large, its vaporized efficiency becomes remarkably higher, as compared with the conventional vaporizers.

Further, vibration is transmitted from vibrators 748 to liquid TEOS caught by the heating unit 744 and in its holes. Heat transfer face and liquid vibrations are thus caused. Therefore, the border layer between the heat transfer face of each hole in the heating unit 744 and liquid TEOS, that is, the heat resistance layer is made thinner. As the result, convection heat transmission is promoted to further raise the vaporized efficiency of liquid TEOS.

According to the vaporizer in this case, gas-like TEOS is moved by pressure difference caused between the inlet 738 and the outlet 740 and thus introduced into the process chamber 710 without using any carrier gas.

Figure 35:
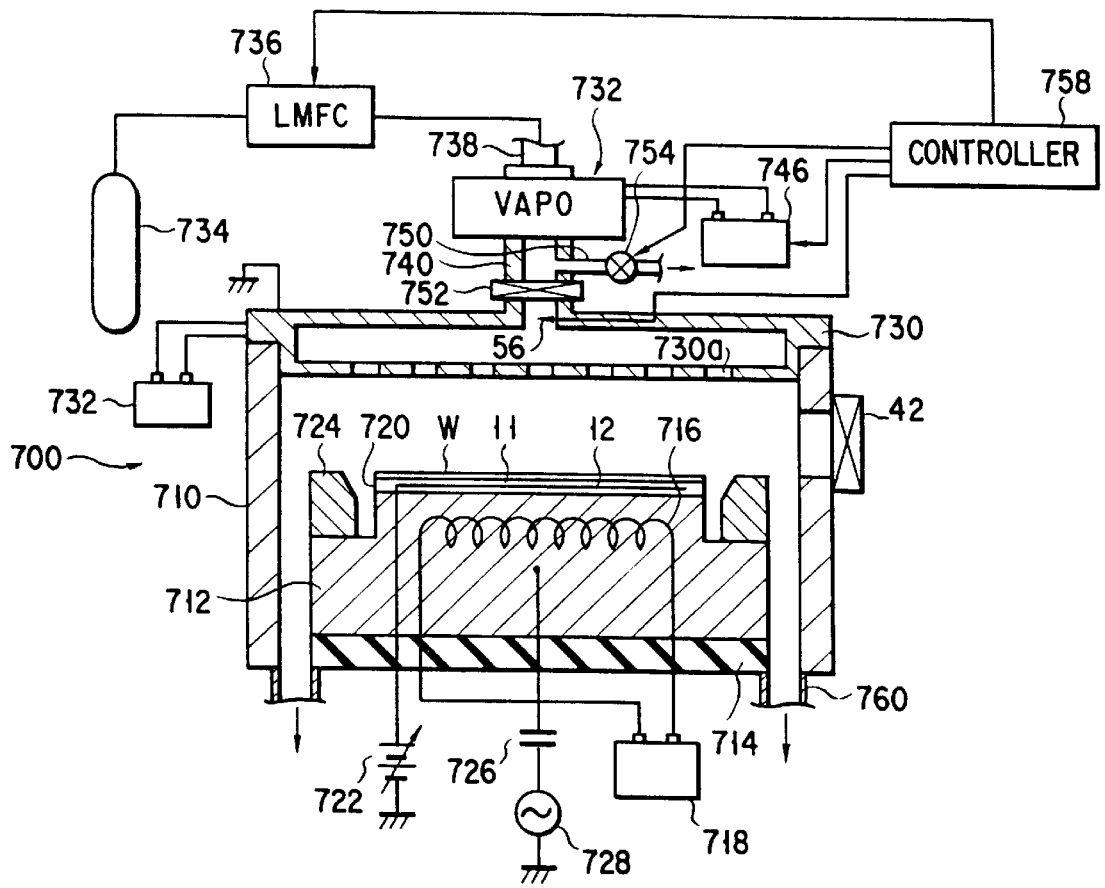
FIG. 35 is a block diagram showing the plasma etching apparatus according to a still further embodiment of the present invention.

A bypass 750 and a stop valve 752 may be attached to the passage extending from the outlet 740 of the vaporizer, as shown in FIG. 35. The bypass 750 is communicated with a clean-up unit (not shown) via a bypass valve 754. The clean-up unit has a burner and others to remove unnecessary gas components. Further, a sensor 756 is also attached to the passage extending from the outlet 740 to detect whether or not liquid TEOS is completely vaporized and whether or not gases are mixed at a correct rate. Detection signal is sent from the sensor 756 to the controller 758.

The operation of the above-described CVD apparatus 700 will be described.

The wafer W is carried into the process chamber 710 which has been decompressed to about $1 \times 10^{-4}$–several Torr, and it is mounted on the suscepter 712. It is then heated to 300° C., for example, by the heater 716. While preparing the process chamber 710 in this manner, liquid TEOS is vaporized by the vaporizer 732. High frequency power is applied from the high frequency power supply 728 to the lower electrode 712 to generate reactive plasma in the process chamber. Activated species in plasma reach the treated face of the wafer W to thereby form P-TEOS (plasma-tetraethylorthosilicate) film, for example, on it.

Other vaporizers will be described referring to FIGS. 37 through 41.

As shown in FIG. 37, a vaporizer 732A may be made integral to an upper electrode 730A of a process chamber 710A. It is attached integral to the upper electrode 730A at the upper portion thereof with an intermediate chamber 770 formed under it. Its housing 742A has a gas outlet side 774 in which a plurality of apertures 772 are formed.

A gas pipe 776 is communicated with the intermediate chamber 770 in the upper electrode 730A to introduce second gas such as oxygen and inert gases into it. A bypass 750A extends from that portion of the upper electrode 730A which is opposed to the gas pipe 776 to exhaust unnecessary gas from the upper electrode 730A. Further, plates 780a, 780b and 780c in which a plurality of apertures 778a, 778b and 778c are formed are arranged in the lower portion of the intermediate chamber 770 with an interval interposed between them.

Figure 39:
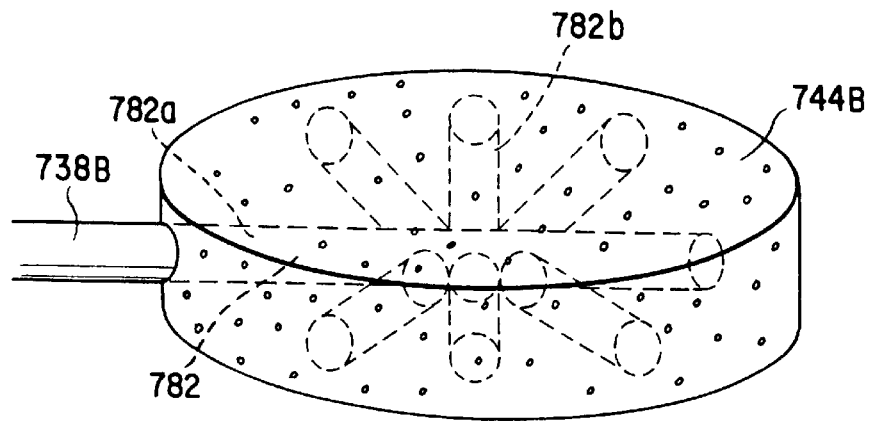
FIG. 39 is a perspective view showing a still further vaporizer.

As shown in FIGS. 38 and 39, a liquid passage 782 is formed in a heating unit 744B in the case of a vaporizer 732B. It includes a center passage 782a and passages 782b radically branching from the center passage 782a. When it is formed in the heating unit 744B in this manner, it enables liquid to be uniformly distributed in the whole of the porous heating unit 744B, thereby raising gas vaporized efficiency to a further extent.

Figure 40:
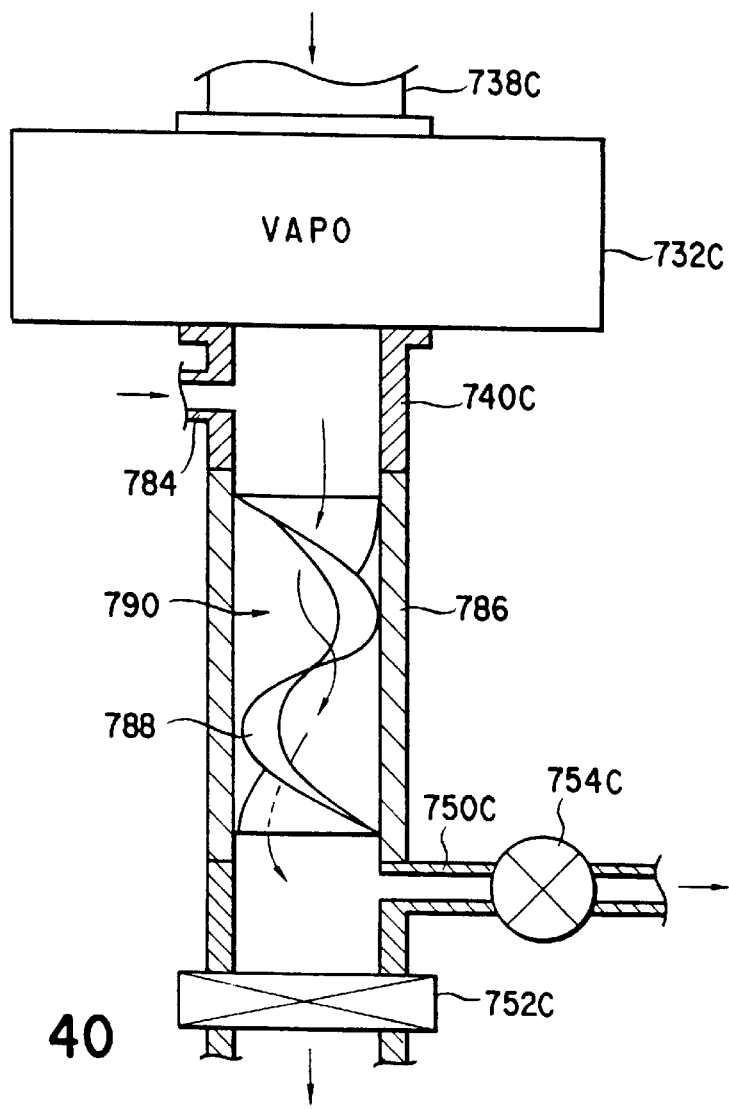
FIG. 40 is a sectional view showing a pipe in which plural kinds of gas are mixed.

After liquid is vaporized by a vaporizer 738C, two or more gases may be mixed, as show In FIG. 40. A second gas supply opening 784 is arranged downstream the vaporizer 738C and second gas component such as oxygen and inert gases is supplied through it. A gas mixing duct 786 extends downstream it and a bypass 750C having a bypass valve 754C, and a stop valve 752C are further arranged in the lower portion of the gas mixing duct 786. A strip-like member 788 is housed in the gas mixing duct 786 to form a spiral passage 790 in it. First and second gas components are fully mixed, while passing through the spiral passage 790, and they reach a point at which the bypass 750 branches from the passage extending to the side of the process chamber.

In addition to TEOS (tetraethylorthosilicate), trichlorsilane ($SiHCl_3$), silicon tetrachloride ($SiCl_4$), pentaethoxytantalum (PEOTa: $Ta(OC_2H_5)_5$), pentamethoxytantalum (PMOTa: $Ta(OCH_3)_5$), tetrasopropoxytitanium (Ti(i-$OC_3H_7)_4$), tetradimethylaminotitanlum (TDMAT: Ti(N$(CH_3)_2)_4$), tetraxisdiethylaminatitanium (TDEAT: Ti(N$(C_2H_5)_2)_4$), titanium tetrachloride ($TiCl_4$), $Cu(HFA)_2$ and $Cu(DPM)_2$ may be used as liquid material to be vaporized. Further, $Ba(DPM)_2$/THF and $Sr(DPX)_2$/THF may be used as thin ferroelectric film forming material. Water ($H_2O$), ethanol ($C_2H_5OH$), tetrahydrofuran (THF: $C_4H_8O$) and dimethylaluminiumhydride (DMAH: $(CH_3)_2AlH$) may also be used.

Figure 41:
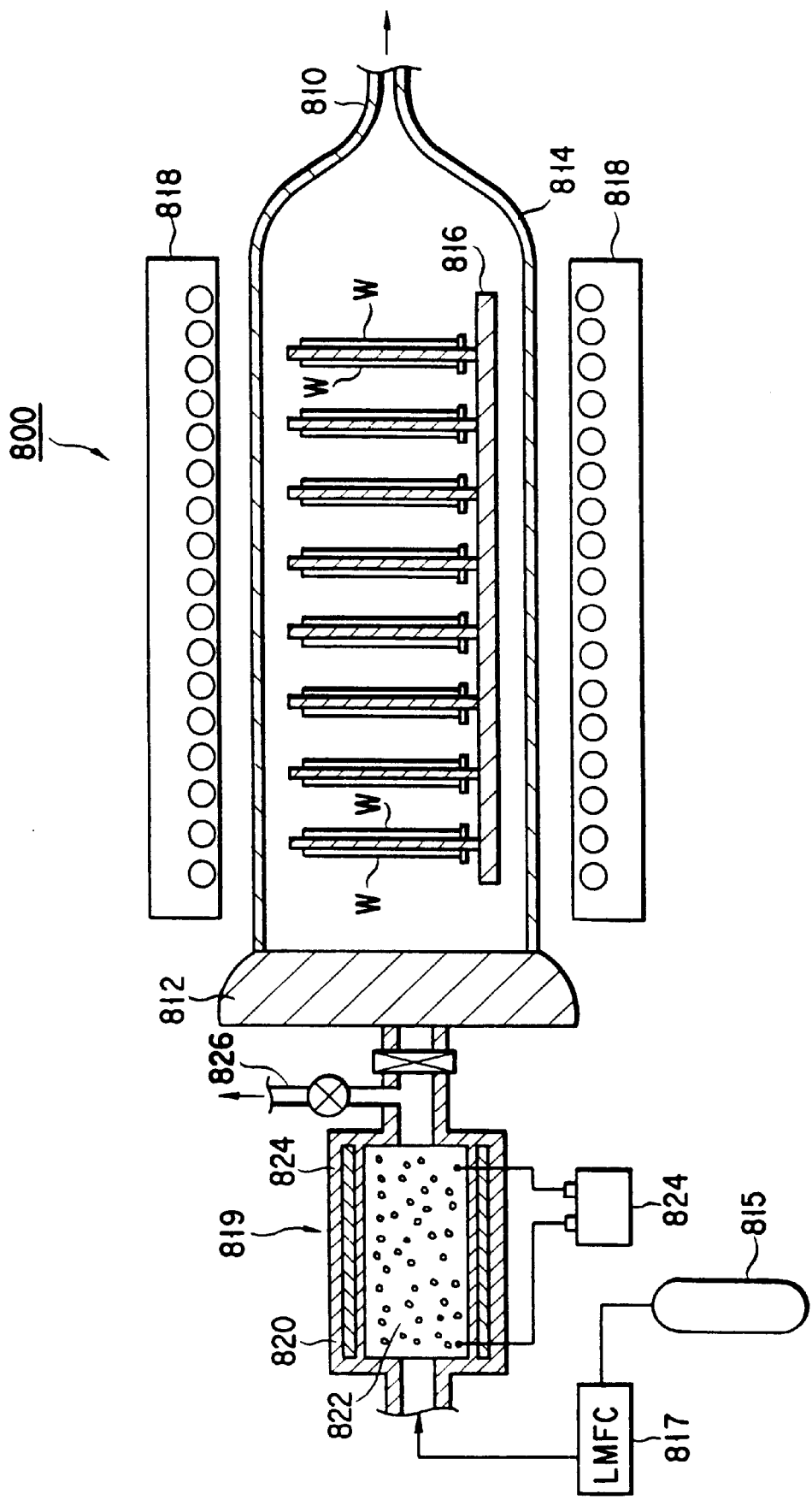
FIG. 41 is a block diagram showing a plasma CVD apparatus provided with the vaporizer.

A vaporizer 819 may be attached to a batch type horizontal plasma CVD apparatus 800, as shown in FIG. 41. This CVD apparatus 800 includes a process chamber 814 provided with an exhaust opening 810 and a process gas supply section 812, a wafer boat 816 and a heater means 818. Connected to the process gas supply section 812 are a process gas supply line or system having a liquid container 815, a liquid mass flow controller 817 and a vaporizer 815.

This vaporizer 819 is substantially same in arrangement as the above-described one 732.

Figure 42:
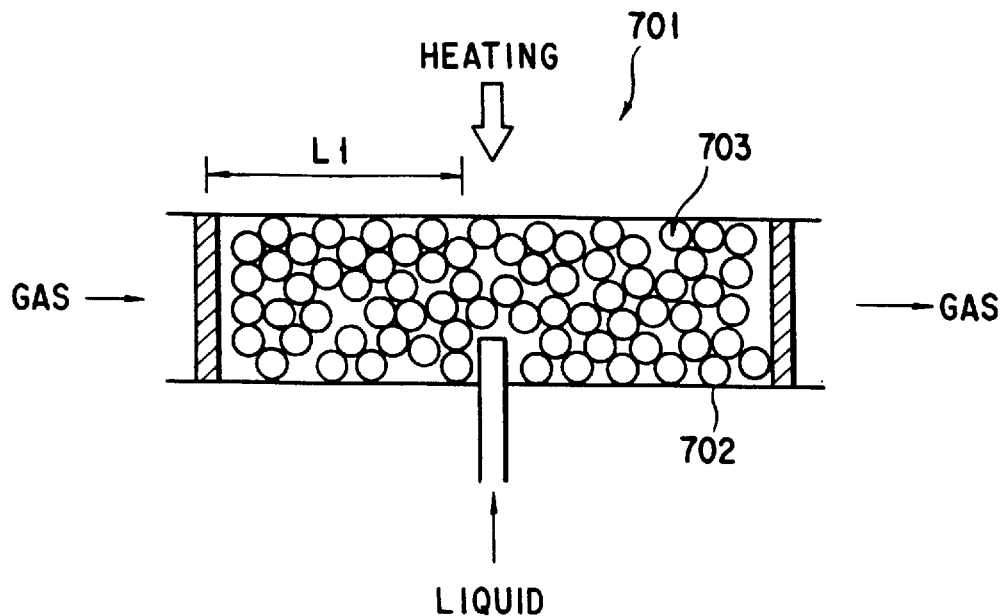
FIG. 42 is a sectional view showing the inside of the conventional vaporizer.

As shown in FIG. 42, a conventional vaporizer 731 has a housing 702 which is kept under atmospheric pressure and which is filled with a plurality of heat transmitting balls 703 each being made of material, excellent in heat transmission. These heat transmitting balls 703 are heated higher than the boiling point of liquid material by an external heater means (not shown) to vaporise liquid material Introduced from below. Carrier gas is introduced into the vaporizer 701 to carry vaporized process gases.

Figure 43:
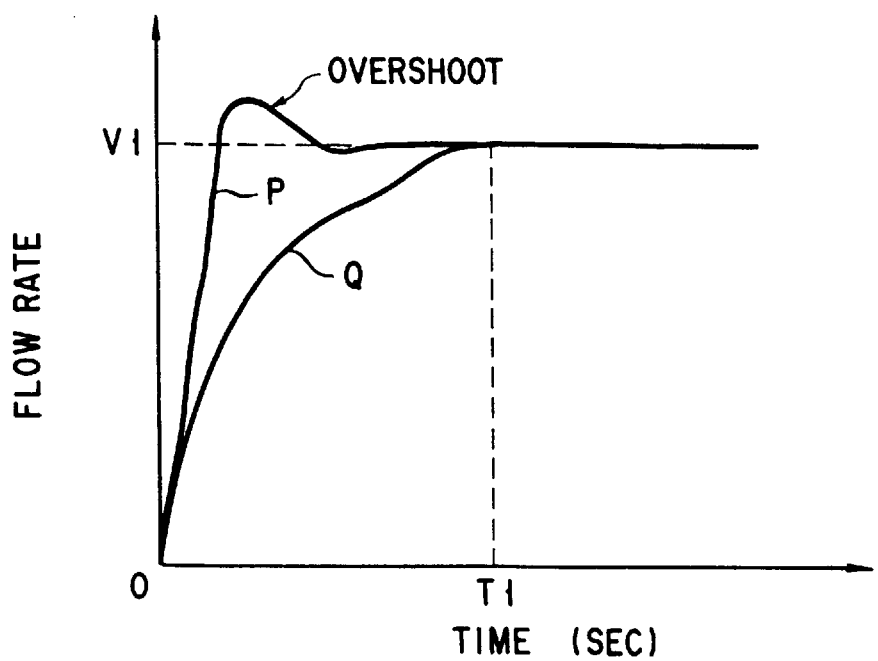
FIG. 43 is a graph showing the change of gas flow rate at the initial stage of gas supply.

In the conventional vaporizer 701, however, gas flow rate becomes excessive at the initial stage of gas supply, that is, overshooting is caused. FIG. 43 is a graph showing how gas flow rates attained by the conventional and our vaporizers change at the initial stage of gas supply, in which time lapse is plotted on the horizontal axis and gas flow rates on the vertical axis. A curve P represents results obtained by the conventional vaporizer and another curve Q those obtained by our present vaporizer. As apparent from FIG. 43, gas flow rate overshoots a predetermined one $V_1$, in the case of the conventional vaporizer, after the lapse of 10–20 seconds since the supply of gas is started. In the above-described vaporizer used by the present invention, however, it reaches the predetermined flow rate $V_1$ without overshooting it.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A plasma treatment apparatus for plasma-treating a substrate under a reduced pressure, comprising:

a chamber electrically connected to ground;

gas supply means for supplying a process gas into said chamber;

exhaust means for exhausting the chamber;

a lower electrode on which said substrate is disposed;

an upper electrode mounted within the chamber to face said lower electrode;

a first power supply connected to the lower electrode through a first matching circuit to apply a high frequency signal to the lower electrode, said high frequency signal having a first frequency $f_1$ lower than an inherent lower ion transit frequency of the process gas;

a second power supply to generate a high frequency signal having a second frequency $f_2$ higher than an inherent upper ion transit frequency of the process gas; and an amplitude modulation circuit connected to each of said first and second power supplies for receiving high frequency signals having the first and second frequencies $f_1$ and $f_2$, the amplitude of the high frequency signal having the second frequency $f_2$ being modulated by the high frequency signal having the first frequency $f_1$, and said amplitude-modulated signal being applied to the upper electrode through the second matching circuit.

2. The plasma treatment apparatus according to claim 1, further comprising a phase controller for shifting the phase of the high frequency signal having the first frequency $f_1$.

* * * * *